(12) United States Patent
Tsubuku et al.

(10) Patent No.: US 9,082,858 B2
(45) Date of Patent: Jul. 14, 2015

(54) TRANSISTOR INCLUDING AN OXIDE SEMICONDUCTOR AND DISPLAY DEVICE USING THE SAME

(75) Inventors: Masashi Tsubuku, Atsugi (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 506 days.

(21) Appl. No.: 13/026,511

(22) Filed: Feb. 14, 2011

(65) Prior Publication Data
US 2011/0204368 A1 Aug. 25, 2011

(30) Foreign Application Priority Data
Feb. 19, 2010 (JP) ................. 2010-035469

(51) Int. Cl.
H01L 29/12 (2006.01)
H01L 27/15 (2006.01)
H01L 29/786 (2006.01)
H01L 27/12 (2006.01)

(52) U.S. Cl.
CPC .......... *H01L 29/7869* (2013.01); *H01L 27/156* (2013.01); *H01L 27/1225* (2013.01)
USPC .................. 257/57; 257/E29.273

(58) Field of Classification Search
CPC .................................. H01L 27/156
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1737044 A | 12/2006 |
| EP | 1950177 A | 7/2008 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Evan Pert
(74) *Attorney, Agent, or Firm* — Eric J. Robinson; Robinson Intellectual Property Law Office, P.C.

(57) ABSTRACT

The band tail state and defects in the band gap are reduced as much as possible, whereby optical absorption of energy which is in the vicinity of the band gap or less than or equal to the band gap is reduced. In that case, not by merely optimizing conditions of manufacturing an oxide semiconductor film, but by making an oxide semiconductor to be a substantially intrinsic semiconductor or extremely close to an intrinsic semiconductor, defects on which irradiation light acts are reduced and the effect of light irradiation is reduced essentially. That is, even in the case where light with a wavelength of 350 nm is delivered at $1 \times 10^{13}$ photons/cm$^2$·sec, a channel region of a transistor is formed using an oxide semiconductor, in which the absolute value of the amount of the variation in the threshold voltage is less than or equal to 0.65 V.

15 Claims, 17 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,084,331 B2 | 12/2011 | Ofuji et al. |
| 8,216,879 B2 * | 7/2012 | Kaji et al. ............... 438/104 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |
| 2011/0076790 A1 | 3/2011 | Ofuji et al. |
| 2011/0109591 A1 | 5/2011 | Kurokawa et al. |
| 2013/0221348 A1 | 8/2013 | Yano et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-533693 | 8/2008 |
| JP | 2008-281988 A | 11/2008 |
| JP | 2009-212443 A | 9/2009 |
| JP | 2009-277701 A | 11/2009 |
| JP | 2009-277702 A | 11/2009 |
| WO | WO-2004/114391 | 12/2004 |
| WO | WO-2007/058248 | 5/2007 |
| WO | WO-2007/094501 | 8/2007 |
| WO | WO-2008/126879 | 10/2008 |
| WO | WO-2009/081677 | 7/2009 |
| WO | WO-2009/110623 | 9/2009 |
| WO | WO-2009/139428 | 11/2009 |
| WO | WO-2009/139482 | 11/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada. T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Miyasaka.M, "SUFTLA Flexible Microelectronics on their way to business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka, Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 1, 2002, vol. 1, pp. 64-68.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

(56) References Cited

OTHER PUBLICATIONS

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m>4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Barquinha.P et al., "Effect of UV and visible light radiation on the electrical performances of transparent TFTs based on amorphous indium zinc oxide,", J. Non-Cryst. Solids (Journal of Non-Crystalline Solids), Apr. 18, 2006, vol. 352, No. 9-20, pp. 1756-1760.

Lee.K et al., "The effect of moisture on the photon-enhanced negative bias thermal instability in Ga—In—Zn—O thin film transistors,", Appl. Phys. Lett. (Applied Physics Letters), Dec. 7, 2009, vol. 95, No. 23, pp. 232106-1-232106-3.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Fung.T et al., "Photofield-Effect in Amorphous InGaZnO TFTs,", IMID '08 Digest of Technical Papers, 2008, pp. 1208-1211.

Inoue.T et al., New construction of photoconductivity and its special response in amorphus In—Ga—Zn—O,, AM-FPD '10 Digest of Technical Papers, Jul. 5, 2010 pp. 33-36.

Lee.D et al., "Steady-state photoconductivity of amorphous In—Ga—Zn—O,", Thin Solid Films, Mar. 31, 2010, vol. 518, No. 11, pp. 3000-3003.

Tsubuku M. et al., 'Photo-Current Response and Negative Bias Stability Under Light Irradiation in IGZO-TFT',, IDW '10 : Proceedings of the 16th International Display Workshops, Dec. 1, 2010, pp. 1841-1844.

Nakamura.M et al., "Synthesis of Homologous Compound with New Long-Period Structure,", NIRIM Newsletter, Mar. 1, 1995, vol. 150, pp. 1-4.

International Search Report (Application No. PCT/JP2011/051684) Dated Apr. 26, 2011.

Written Opinion (Application No. PCT/JP2011/051684) Dated Apr. 26, 2011.

* cited by examiner

TRANSISTOR INCLUDING AN OXIDE SEMICONDUCTOR AND DISPLAY DEVICE USING THE SAME

TECHNICAL FIELD

The present invention relates to a semiconductor element such as a transistor and/or a display device at least part of which is formed using a semiconductor element. For example, an active element formed including an oxide semiconductor as a semiconductor element is illustrated, and a display device using the active element is illustrated.

BACKGROUND ART

Although transistors formed using amorphous silicon had been used for conventional display devices typified by liquid crystal televisions, an oxide semiconductor has attracted attention as a material which replaces a silicon semiconductor in order to form transistors. For example, an active matrix display device, in which an amorphous oxide including In, Ga, and Zn is used for an active layer of a transistor and the electron carrier concentration of the amorphous oxide is lower than $10^{18}/cm^3$, is disclosed (see Patent Document 1).

However, some problems of a transistor formed using an oxide semiconductor have been pointed out. One of these is stability of characteristics, and it is pointed out that threshold voltage is changed by irradiation with visible light and ultraviolet light (e.g., see Non-Patent Document 1). Further, a problem, in which characteristics are changed by a bias-temperature stress test in terms of reliability of a transistor, has been pointed out (e.g., see Non-Patent Document 2).

REFERENCE

[Patent Document 1] Japanese Published Patent Application No. 2006-165528

Non-Patent Document 1

P. Barquinha, A. Pimentel, A. Marques, L. Pereira, R. Martins, and E. Fortunato, "Effect of UV and visible light radiation on the electrical performances of transparent TFTs based on amorphous indium zinc oxide", *Journal of Non-Crystalline Solids* 352, (2006) 1756-1760

Non-Patent Document 2

Kwang-Hee Lee, Ji Sim Jung, Kyoung Seok Son, Joon Seok Park, Tae Sang Kim, Rino Choi, Jae Kyeong Jeong, Jang-Yeon Kwon, Bonwon Koo, and Sangyun Lee, "The effect of moisture on the photon-enhanced negative bias thermal instability in Ga—In—Zn—O thin film transistors", *APPLIED PHYSICS LETTERS* 95, (2009) 232106

DISCLOSURE OF INVENTION

An oxide semiconductor formed using a metal oxide has a band gap of approximately 3 eV and originally includes a light-transmitting property with respect to visible light. In the oxide semiconductor of Patent Document 1 described above, when a transistor is irradiated with light having energy which is close to a band gap or higher than or equal to the band gap, it has been pointed out that the threshold voltage is changed by approximately 10 V. When the threshold voltage of the transistor is largely changed in this manner, a circuit which is formed using such a transistor does not operate normally, and it is difficult to display an image.

Any method for improving a change in characteristics, caused by such light irradiation, of a transistor formed using an oxide semiconductor is not proposed, which causes a delay in practical use while the oxide semiconductor is expected as a new material.

In view of such a background, an object of one embodiment of the present invention is to reduce the influence of the effect of light irradiation in a semiconductor element such as a transistor formed using an oxide semiconductor and/or a display device or the like formed using the semiconductor element.

Even when an oxide semiconductor whose band gap is greater than or equal to 2.5 eV, preferably greater than or equal to 3 eV is irradiated with light having energy of less than or equal to the band gap, it is not originally supposed that the irradiation light is absorbed. As disclosed in Non-Patent Document 1, it is assumed that the threshold voltage of the transistor is fluctuated when light (from visible light to ultraviolet light) having energy of less than or equal to a band gap is delivered because the irradiation light is absorbed by an oxide semiconductor layer and charge defects occur.

Thus, one embodiment of the present invention is to reduce the band tail state and defects in the band gap as much as possible, whereby optical absorption of energy which is in the vicinity of the band gap or less than or equal to the band gap is reduced to solve the problem. In that case, not by merely optimizing conditions of manufacturing an oxide semiconductor film, but by making an oxide semiconductor to be a substantially intrinsic or substantially close to intrinsic semiconductor, whereby defects on which the irradiation light acts are reduced and the effect of light irradiation is reduced essentially.

Even in the case where an oxide semiconductor used for a transistor is irradiated with light with a wavelength of 350 nm (or light with a wavelength of greater than or equal to 400 nm and less than or equal to 410 nm) at $1 \times 10^{13}$ photons/cm$^2$·sec (or irradiated at an intensity of 10 µW/cm$^2$ for 90 seconds), a transistor, in which an absolute value of the amount of the variation of the threshold voltage due to the irradiation of light is less than or equal to 0.65 V, preferably less than or equal to 0.55 V, is used. Alternatively, under a similar light irradiation condition, a transistor, in which an absolute value of an amount of a variation to negative side of a shift value from an initial value (a shift value when the transistor is not irradiated with light) is less than or equal to 3.0 V, preferably less than or equal to 2.5 V, is used.

The above-described characteristics can be obtained in such a manner that an impurity which forms an impurity level is removed from an oxide semiconductor as much as possible. For example, it is apparent that, in the oxide semiconductor, oxygen vacancy or contained hydrogen forms an impurity level by a first principle calculation.

Here, a result of an oxide semiconductor including In, Ga, and Zn (here, referred to as IGZO) obtained by the first principle calculation is shown. In the calculation, assumed were three cases: (a) the case where a stoichiometric ratio is satisfied; (b) the case where oxygen vacancy exists; and (c) the case where hydrogen is added. In the model used for the calculation, a unit cell, in which a composition ratio satisfies In:Ga:Zn:O=1:1:1:4 and the density is 5.9 g/cm$^3$ with respect to 84 atoms, was assumed and an amorphous structure was reproduced by a classical molecular dynamics method (see FIG. 16). Then, a structure was optimized by a quantum molecular dynamics method, and the electronic state was calculated. Note that the size of each atom in FIG. 16 is determined for convenience in order to distinguish atoms, and they do not represent the actual size of each atom.

FIGS. 17A to 17C show the calculation results of the above-described three cases. FIGS. 17A to 17C show density of state (DOS) of each case, and a portion showing an energy of 0 (zero) in each graph represents the Fermi level. In the case of FIG. 17A where the stoichiometric ratio is satisfied, the Fermi level exists at the upper end of the valence band. However, in the case of FIG. 17B where oxygen vacancy exists in IGZO and in the case of FIG. 17C where hydrogen is added to IGZO, the Fermi level exists in the conduction band. As a result, it is shown that the oxygen vacancy and contained hydrogen in the oxide semiconductor form an impurity level.

In order that hydrogen is not included in the oxide semiconductor, hydrogen and moisture are made not to remain when an oxide semiconductor film is formed. It is important that hydrogen and moisture inevitably included in the oxide semiconductor film be subjected to dehydration or dehydrogenation by the later treatment. Dehydration or dehydrogenation of the oxide semiconductor can be performed by heat treatment at, for example, 250° C. to 700° C., preferably 400° C. to 650° C. In addition, treatment to supply oxygen to the oxide semiconductor has an advantageous effect on repair of a defect of the oxide semiconductor film after dehydration or dehydrogenation treatment. For example, the oxide semiconductor film is subjected to heat treatment in an oxygen atmosphere or a silicon oxide film or the like is provided in contact with the oxide semiconductor film and heat treatment is performed, whereby oxygen can be supplied and a defect can be repaired.

In a transistor formed using such an oxide semiconductor, in addition to the suppression of the variation in characteristics due to light irradiation, when application of a positive gate bias to the gate electrode of the transistor and application of a negative gate bias to the gate electrode of the transistor are performed at the same electric field strength for the same period, an amount of a variation of threshold voltage of the transistor due to the application of the negative gate bias to the gate electrode of the transistor can be smaller than an amount of a variation in threshold voltage of the transistor due to the application of the positive gate bias to the gate electrode of the transistor, and the absolute value of the amount of the variation can be less than or equal to 2.57 V.

Note that in this specification, the ordinal number such as "first", "second", or "third" is given for convenience to distinguish elements, and not given to limit the number, the arrangement, and the order of the steps unless otherwise specified.

When a component is mentioned as being "over" or "under" another component in this specification, the two components are in direct contact with each other in some cases; however, another component may be present between the two components in other cases.

In this specification, terms in a singular form which are used for description of the embodiments include a concept of plural, unless it is contextually clear that a singular form or a plural form is intentionally used. Terms such as "include" and "have" indicate the existence of a characteristic, a number, a step, an operation, a component, a member, or a combination of any of these, which is described in this specification, and do not exclude a possibility that one or more other features, numbers, steps, operations, components, members, combinations of any of these, or the like may exist or be added.

Unless otherwise specifically defined in this specification, all the terms which are used including the technical or scientific terms have the same meaning as ones which can be generally understood by those who have conventional knowledge in the technical field to which the present invention belongs. The terms which are the same as ones defined in a commonly-used dictionary should be interpreted as including the meaning in accordance with the meaning in the context of the related art, and should not be interpreted as being ideally or excessively literally unless they are defined clearly in this specification.

According to one embodiment of the present invention, hydrogen, moisture, or the like which becomes a factor of generating a defect or a structural disorder in an oxide semiconductor is removed, and high purity of the oxide semiconductor is achieved, whereby the variation in characteristics of a transistor under light irradiation can be greatly reduced as compared to those of a conventional transistor. Therefore, the operation of a transistor can be stabilized even when the transistor is irradiated with light.

According to one embodiment of the present invention, even in the case of a transistor in which an oxide semiconductor layer is used for a channel formation region, the variation in the threshold voltage due to light irradiation can be suppressed, whereby the operation of a display device in which the transistor is used for a pixel portion can be stabilized. That is, even when a transistor of a pixel is irradiated with light from an illumination light source in a display device utilizing the electro-optical operation of liquid crystal, the threshold voltage of the transistor is not greatly changed, whereby display of an image can be performed well. In addition, even when a display device is provided with a light-emitting element such as an electroluminescence element in a pixel, malfunction of a transistor in the pixel by light of the light-emitting element can be prevented.

BRIEF DESCRIPTION OF DRAWINGS

FIG. 17A shows the case where a stoichiometric ratio is satisfied, FIG. 17B is the case where oxygen vacancy exists, and FIG. 17C is the case where hydrogen is added.

BEST MODE FOR CARRYING OUT THE INVENTION

Figure 1:
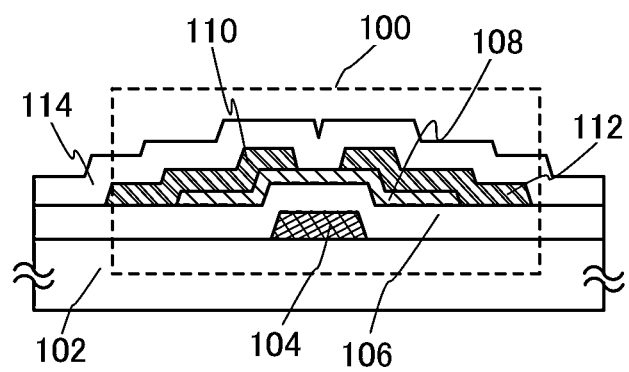
FIG. 1 is a cross-sectional view illustrating one embodiment of a semiconductor device.

Embodiments of the present invention disclosed are described below with reference to the drawings. However, the present invention is not limited to the following description, and it is easily understood by those skilled in the art that modes and details can be changed in various ways without departing from the spirit and scope of the present invention. Therefore, the present invention is not interpreted as being limited to the description of the embodiments below.

Further, in the embodiments hereinafter described, the same parts are denoted with the same reference numerals throughout the drawings. Note that components illustrated in the drawings, that is, a thickness or a width of a layer, a region, or the like, a relative position, and the like are exaggerated in some cases for clarification in description of embodiments.

Embodiment 1

The structure of a transistor according to one embodiment of the present invention will be described with reference to FIG. 1, FIGS. 2A and 2B, FIGS. 3A and 3B, FIGS. 4A and 4B, FIGS. 5A and 5B, and FIG. 6.

A transistor 100 illustrated in FIG. 1 is a bottom-gate transistor and is also called an inverted staggered transistor. The transistor 100 includes, over a substrate 102 having an insulating surface, a gate electrode 104, a gate insulating layer 106, an oxide semiconductor layer 108, a source electrode 110, and a drain electrode 112. An insulating layer 114 is provided to cover the transistor 100 and be stacked over the oxide semiconductor layer 108.

The oxide semiconductor layer 108 is an intrinsic (i-type) or substantially intrinsic (i-type) oxide semiconductor layer which is obtained by removing hydrogen, moisture, or the like which is an impurity for an oxide semiconductor, and highly purifying the oxide semiconductor so that impurities which serve as carrier donors other than main components of the oxide semiconductor are not contained as much as possible.

Hydrogen, moisture, or the like included in the oxide semiconductor layer 108, which becomes a factor of generating a defect or a structural disorder, is removed, and high purity of the oxide semiconductor layer 108 is achieved, whereby the variation in characteristics of a transistor under light irradiation can be greatly reduced as compared to that of a conventional transistor.

FIGS. 2A and 2B, FIGS. 3A and 3B, FIGS. 4A and 4B, FIGS. 5A and 5B, and FIG. 6 each show evaluation results of electrical characteristics of transistors (samples 1 to 3) which are formed using a high-purity oxide semiconductor layer. The transistors of samples 1 to 3 each have an inverted staggered structure which is similar to the structure of the transistor 100 illustrated in FIG. 1.

A method for manufacturing the transistors of samples 1 to 3 will be described. A glass substrate was used as the substrate 102. A tungsten film having a thickness of 150 nm was formed by a sputtering method as the gate electrode 104. As the gate insulating layer 106, a silicon oxynitride film having a thickness of 100 nm was formed by a plasma-enhanced CVD method over the gate electrode 104 (sample 1 and sample 2). Note that a high density plasma-enhanced CVD method was used as a method for forming the gate insulating layer 106 in sample 3.

Over the gate insulating layer 106, an oxide semiconductor film was formed by a sputtering method using an oxide semiconductor target ($In_2O_3$:$Ga_2O_3$:ZnO=1:1:1 [molar ratio]). In sample 1 and sample 2, argon and oxygen (argon: oxygen=30 sccm: 15 sccm) were used as a sputtering gas, and an oxide semiconductor film having a thickness of 50 nm was formed. In sample 3, oxygen was used as a sputtering gas, and an oxide semiconductor film having a thickness of 30 nm was formed. Further, the oxide semiconductor film was processed in an island shape, and an island-shaped semiconductor layer was formed.

Next in samples 1 to 3, the oxide semiconductor layer was subjected to heat treatment as dehydration or dehydrogenation treatment, and the high-purity oxide semiconductor layer 108 was formed. The conditions of heat treatment on the oxide semiconductor layer were set as follows: the condition of sample 1 was at 450° C. in a nitrogen atmosphere for one hour (electric furnace); the condition of sample 2 was at 600° C. in a nitrogen atmosphere for one hour (electric furnace); and the condition of sample 3 was at 650° C. in a nitrogen atmosphere for six minutes (gas rapid thermal anneal (GRTA) apparatus).

As the source electrode 110 and the drain electrode 112, a titanium film (having a thickness of 50 nm in each of sample 1 and sample 2, while having a thickness of 100 nm in sample 3), an aluminum film (having a thickness of 100 nm in each of sample 1 and sample 2, while having a thickness of 200 nm in sample 3), and a titanium film (having a thickness of 50 nm in each of sample 1 and sample 2, while having a thickness of 100 nm in sample 3) were stacked over the oxide semiconductor layer 108 by a sputtering method.

Over the oxide semiconductor layer 108, the source electrode 110, and the drain electrode 112, a silicon oxide film having a thickness of 300 nm was formed by a sputtering method as the insulating layer 114.

In samples 1 to 3, an opening reaching the source electrode 110 or the drain electrode 112 is formed in the insulating layer 114, and a wiring layer was formed in the opening by a sputtering method. The wiring layer of each of sample 1 and sample 2 was a stack of a titanium film (having a thickness of 50 nm), an aluminum film (having a thickness of 100 nm), and a titanium film (having a thickness of 50 nm), while the wiring layer of sample 3 was an indium tin oxide including silicon oxide (ITSO) film (having a thickness of 110 nm).

Then, heat treatment was performed at 250° C. in a nitrogen atmosphere for one hour. The channel length (L) of the oxide semiconductor layer of the transistor of each of sample 1 and sample 2 is 20 μm and the channel width (W) thereof is 20 μm. The channel length (L) of the oxide semiconductor layer of the transistor of sample 3 is 3 μm and the channel width (W) thereof is 50 μm.

Light irradiation was measured in order to evaluate the variations in characteristics of samples 1 to 3 with respect to light irradiation. In order to measure initial characteristics of the transistors of samples 1 to 3 for measuring light irradiation, a change in characteristics of the source-drain current (hereinafter referred to as a drain current (Id)), i.e., Vg-Id characteristics, was measured under conditions that the substrate temperature was set to room temperature, the source-drain voltage (hereinafter referred to as a drain voltage (Vd)) was set to 10 V, and the source-gate voltage (hereinafter referred to as a gate voltage (Vg)) was varied from −20 V to +20 V.

Figure 2A:
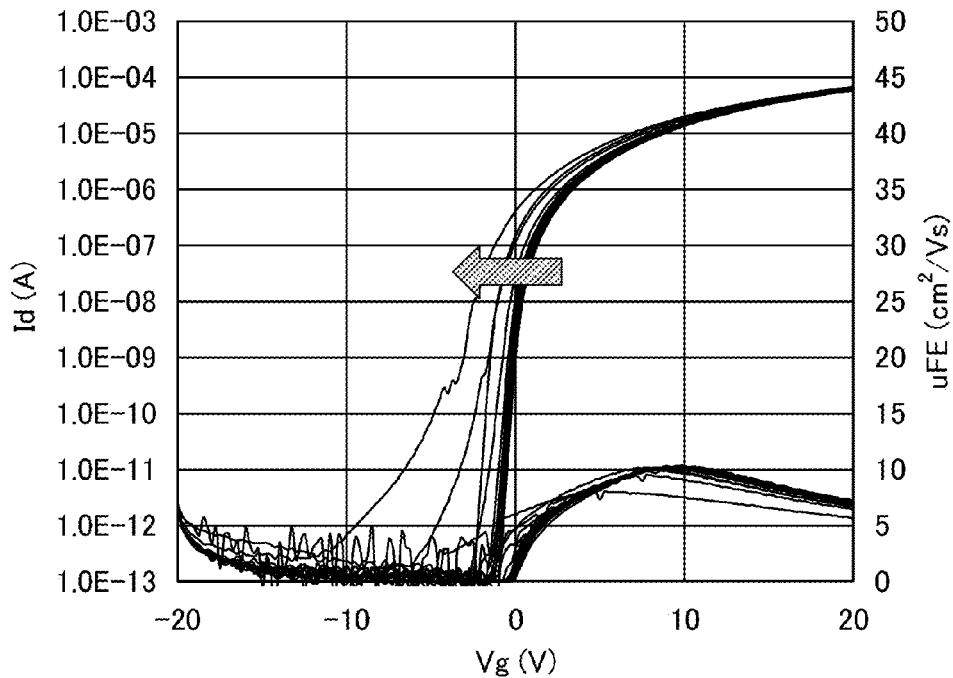
FIGS. 2A and 2B are graphs each showing evaluation results of electrical characteristic of a transistor of sample 1.
Figure 3A:
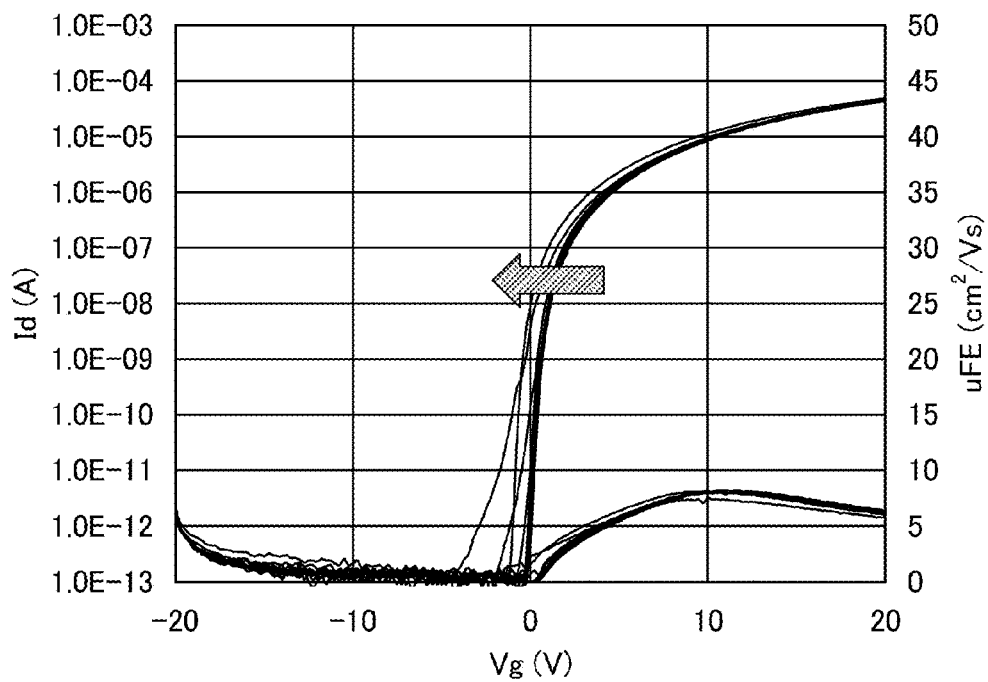
FIGS. 3A and 3B are graphs each showing evaluation results of electrical characteristics of a transistor of sample 2.
Figure 4A:
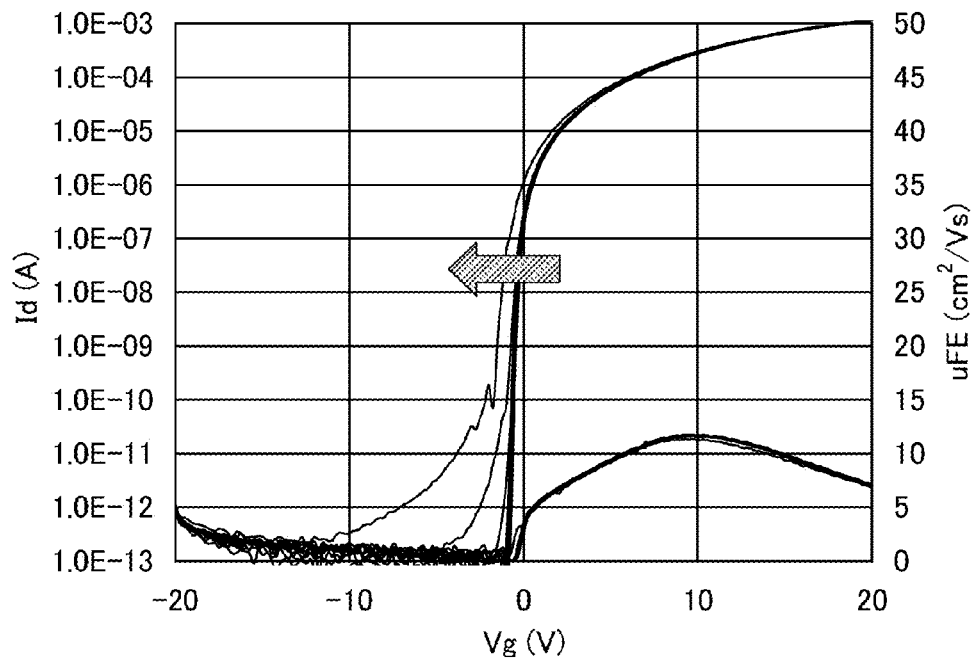
FIGS. 4A and 4B are graphs each showing evaluation results of electrical characteristics of a transistor of sample 3.

Next, Vg-Id characteristics in a wavelength of each light were measured while the transistors of sample 1 to 3 were irradiated with light using a spectral sensitivity measuring apparatus from the gate insulating layer 114 side which is opposite to the gate electrode 104. The irradiation conditions of light were as follows: the energy was 10 µW/cm$^2$; the wavelengths were 800 nm, 600 nm, 500 nm, 450 nm, 425 nm, 400 nm, 375 nm, and 350 nm; and the irradiation time was 90 seconds. Note that as the measurement of the Vg-Id characteristics of the transistors in samples 1 to 3 in light irradiation, a change in characteristics (Vg-Id characteristics) of the drain current (Id) was measured under conditions that the drain voltage (Vd) was set to 10 V and the gate voltage (Vg) was varied from −20 V to +20 V at room temperature, in a manner similar to that of the initial characteristics. FIG. 2A shows the Vg-Id characteristics of sample 1 in light irradiation of each wavelength. FIG. 3A shows the Vg-Id characteristics of sample 2 in light irradiation of each wavelength. FIG. 4A shows the Vg-Id characteristics of sample 3 in light irradiation of each wavelength. In each of FIG. 2A, FIG. 3A, and FIG. 4A, the Vg-Id characteristics move in a direction (negative side) of an arrow as the wavelength decreases from 800 nm to 350 nm.

Figure 2B:
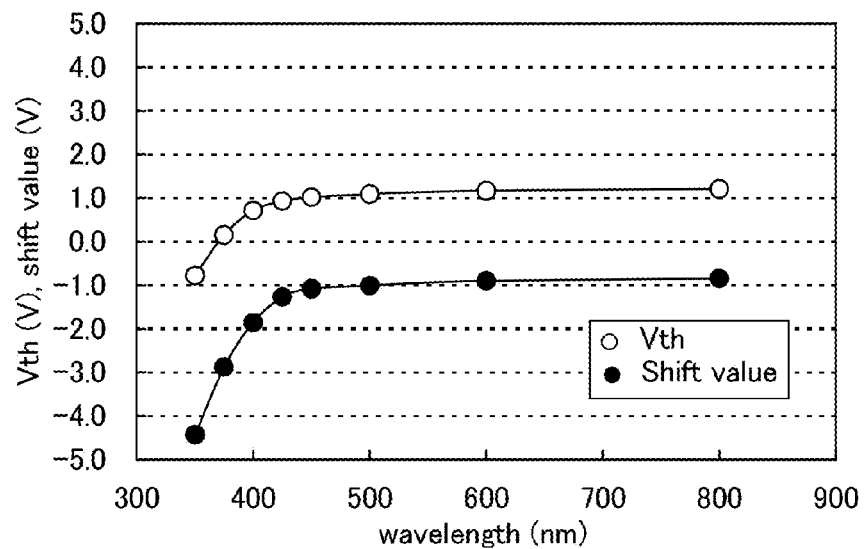
Figure 3B:
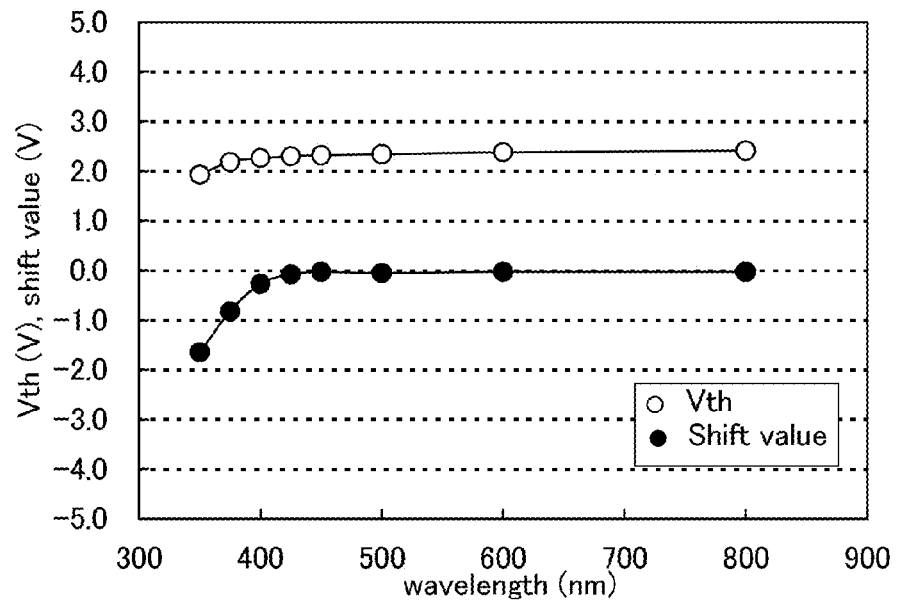
Figure 4B:
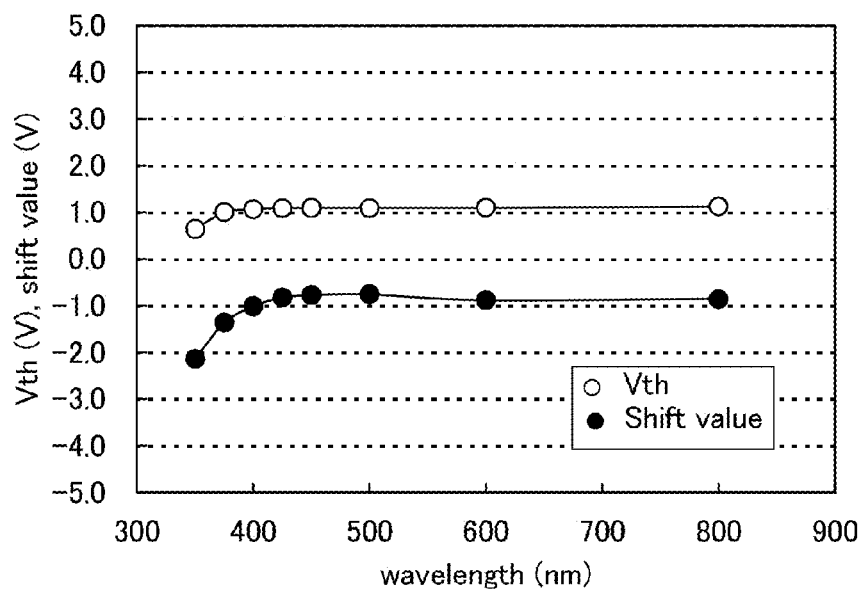

In sample 1, sample 2, and sample 3, threshold voltage (Vth(V)) and a shift value (V) are calculated from the Vg-Id characteristics shown in FIG. 2A, FIG. 3A, and FIG. 4A, respectively, and the relations between a wavelength of light and the threshold voltage (Vth(V)) and between the wavelength of light and the shift value (V) are shown in FIG. 2B, FIG. 3B, and FIG. 4B, respectively.

Figure 15:
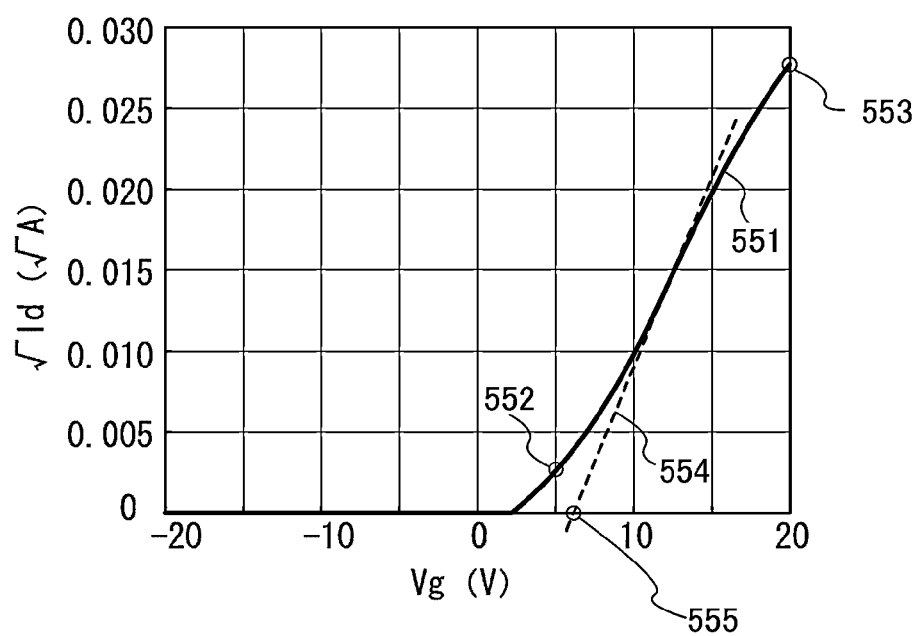
FIG. 15 is a graph showing electrical characteristics of a transistor.
Figure 16:
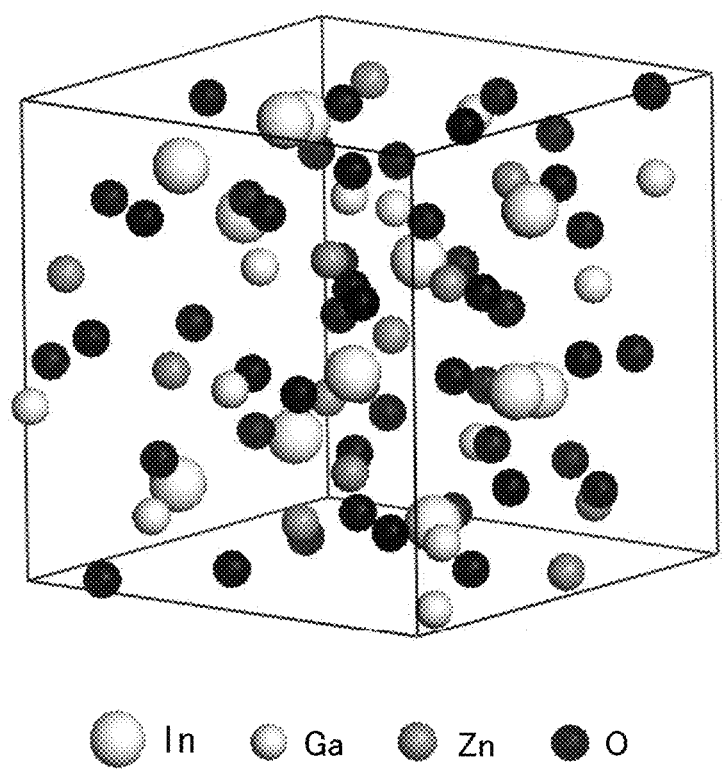
FIG. 16 is a diagram illustrating an oxide semiconductor (IGZO) having an amorphous structure reproduced by a classical molecular dynamics method.
Figure 17A:
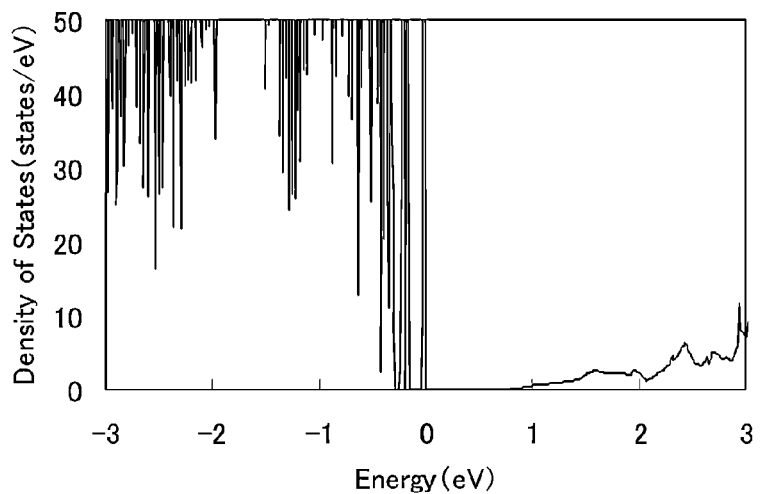
FIGS. 17A to 17C are graphs each showing a result in which an electronic state of an oxide semiconductor is calculated by a first principle calculation.
Figure 17B:
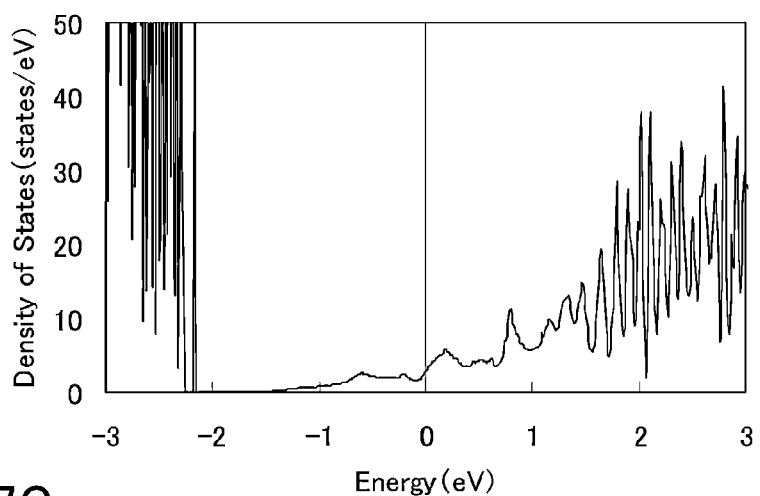
Figure 17C:
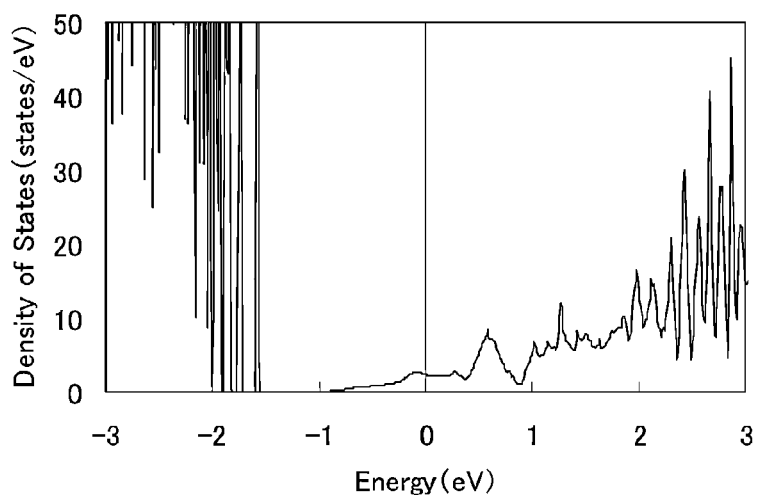

Here, the definition of the threshold voltage (Vth) is described using FIG. 15 as an example. A gate voltage is plotted on a linear scale on the horizontal axis, and a square root of drain current (hereinafter also referred to as √Id) is plotted on a linear scale on the vertical axis. A curve 551 represents a square root of drain current with respect to a change in gate voltage and shows Id of a Vg-Id curve obtained by setting Vd to 10 V with its square root (such a Vd-Id curve is hereinafter also referred to as a √Id curve).

First, a √Id curve (the curve 551) is obtained from the Vg-Id curve obtained by measurement in which Vd is set to 10 V. Then, a tangent line 554 to the √Id curve at a point where the √Id curve has a maximum differential value (at a point where the √Id curve has a maximum slope) is obtained. Then, the tangent line 554 is extended, and Vg at a point where Id is 0 A on the tangent line 554, that is, a value at an intercept 555 of the tangent line 554 and the gate voltage axis is defined as Vth.

Note that the definition of the shift value is described using FIG. 2B, FIG. 3B, and FIG. 4B as an example. The gate voltage (Vg) value when drain current (Id) becomes 1×10$^{-10}$ A in the light irradiation measurement is defined as the shift value.

Figure 5A:
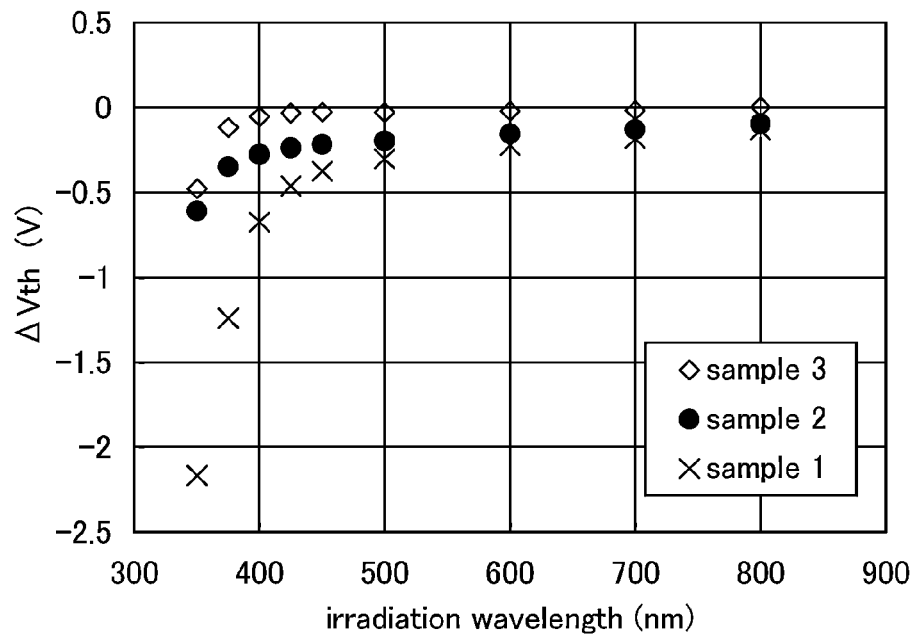
FIGS. 5A and 5B are graphs each showing evaluation results of electrical characteristics of transistors of samples 1 to 3.
Figure 5B:
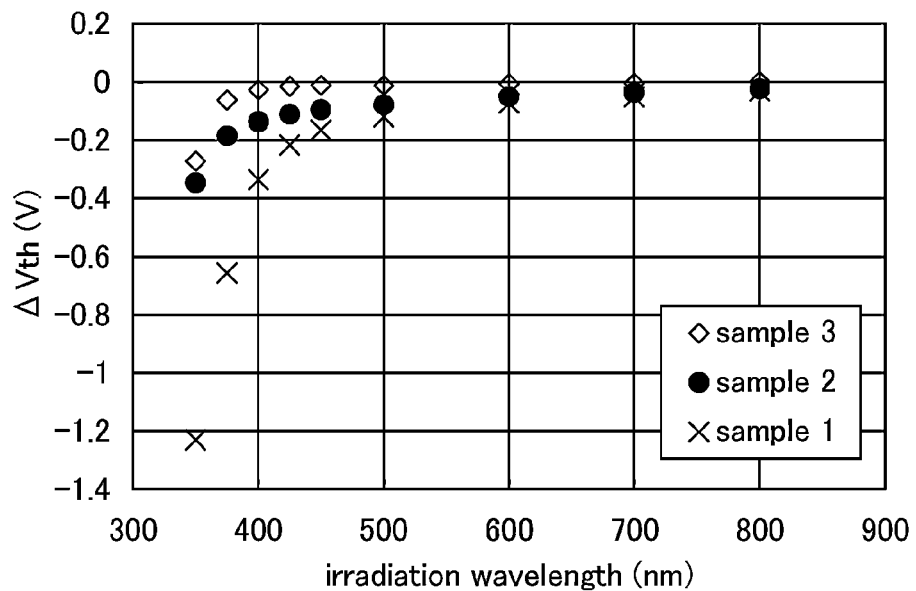

In addition, the relations between irradiation wavelengths and variation values (ΔVth(V)) of the threshold voltage of samples 1 to 3 are shown of in FIGS. 5A and 5B. The variation values (ΔVth) of the threshold voltage are the amount of the variations from the threshold voltage in initial characteristics to the threshold voltage in each irradiation wavelength. FIG. 5A shows the relation of the variation values (ΔVth) of the threshold voltage with respect to a wavelength of light in the case where irradiation energy of light is fixed (10 µW/cm$^2$). FIG. 5B shows the relation of the variation values (ΔVth) of the threshold voltage with respect to a wavelength of light in the case where the number of photons (Np) per unit time and unit area is fixed (1×10$^{13}$/cm$^2$·sec (1×10$^{13}$ cm$^{-2}$·sec$^{-1}$)) and FIG. 5A was normalized with the number of photons. Note that the normalization was performed by the following equation: the number of photons (Np)=(irradiation energy of light (E)·wavelength of light (λ))/(Planck's constant (h)·velocity of light (c)).

It is found from FIG. 5A that the variation values (ΔVth) of the threshold voltage of sample 1, sample 2, and sample 3 at a wavelength of 350 nm were −2.17 V, −0.61 V, and −0.48 V, respectively and the variation values (ΔVth) of the threshold voltages of sample 1, sample 2, and sample 3 at a wavelength of 400 nm were −0.68 V, −0.28 V, and −0.05 V, respectively.

Note that the variations in the threshold voltage of the transistors of samples 1 to 3 in light irradiation were a phenomenon generated during light irradiation, and were a reversible change in which the threshold voltage returns to the initial characteristics again after light irradiation is stopped.

To examine reliability of transistors, a bias-temperature stress test (hereinafter referred to as a "BT test") was performed. The BT test is one kind of accelerated test and can evaluate a change in characteristics, caused by long-term usage, of transistors in a short time. In particular, the amount of the variation (the amount of change) in threshold voltage of the transistor between before and after the BT test is an important indicator for examining reliability. As the amount of the variation in the threshold voltage between before and after the BT test is small, the transistor has higher reliability.

Specifically, the temperature of a substrate over which a transistor is formed (substrate temperature) is set at fixed temperature, a source and a drain of the transistor are set at the same potential, and a gate is supplied with a potential which is different from those of the source and the drain for a certain period. The substrate temperature may be determined as appropriate in accordance with the test purpose. A BT test in which a potential applied to a gate is higher than the potential of a source and a drain is referred to as +BT test, and a BT test in which a potential applied to a gate is lower than the potential of a source and a drain is referred to as −BT test.

The conditions for the BT test can be determined in accordance with a substrate temperature, intensity of electric field applied to a gate insulating layer, and the time of application of electric field. The intensity of the electric field applied to the gate insulating film is determined in accordance with a value obtained by dividing a potential difference between a gate and a source and a drain by the thickness of the gate insulating layer. For example, when the intensity of the electric field applied to the gate insulating layer with a thickness of 100 nm is adjusted to 2 MV/cm, the potential difference may be set to be 20 V.

The results of the BT test performed on the transistors of samples 1 to 3 are described. Both a BT test where a positive gate bias was applied (hereinafter referred to as a "+BT test") and a BT test where a negative gate bias was applied (hereinafter referred to as a "−BT test") were performed under the following conditions: the substrate temperature was set to 150° C.; the intensity of an electric field applied to the gate insulating layer was set to 2 MV/cm; and the time of application was set to one hour.

First, the +BT test will be described. In order to measure initial characteristics of a transistor subjected to the BT test, a change in characteristics of the drain current, i.e., Vg-Id characteristics, was measured under conditions that the substrate temperature was set to 40° C., the drain voltage was set to 10 V, and the gate voltage was varied from −20 V to +20 V. Here, as a countermeasure against moisture absorption onto surfaces of the samples, the substrate temperature was set to 40° C. However, the measurement may be performed at room temperature (25° C.) if there is no particular problem.

Next, after the substrate temperature was increased to 150° C., the potentials of the source and the drain of the transistor were set to 0 V. Then, voltage was applied to the gate so that the intensity of an electric field applied to the gate insulating layer was 2 MV/cm. Since the thickness of the gate insulating layer in each of the transistors of samples 1 to 3 was 100 nm here, a voltage of +20 V was kept being applied to the gate for one hour. The time of voltage application was one hour here; however, the time may be changed as appropriate in accordance with the purpose.

Next, the substrate temperature was decreased to 40° C. while voltage is applied between the gate and the source and the drain. If application of voltage is stopped before the substrate temperature was completely decreased to 40° C., the transistor which has been damaged during the BT test is repaired by the influence of residual heat. Thus, the substrate temperature must be decreased while the voltage is applied. After the substrate temperature was decreased to 40° C., the application of voltage was stopped. Strictly, the time of decreasing temperature must be added to the time of voltage application; however, since the temperature was able to be decreased to 40° C. in several minutes actually, this was considered to be an error range and the time of decreasing temperature was not added to the time of voltage application.

Then, Vg-Id characteristics were measured under the same conditions as those of the measurement of the initial characteristics, and Vg-Id characteristics after the +BT test were obtained.

Next, the −BT test will be described. The −BT test was performed in almost the same manner as that of the +BT test; however, the −BT test was different from the +BT test in that voltage applied to the gate after the substrate temperature was increased to 150° C. was −20 V.

In the BT test, it is important to use a transistor which has never been subjected to a BT test. For example, if a −BT test is performed with the use of a transistor which has been once subjected to a +BT test, the results of the −BT test cannot be evaluated correctly due to influence of the +BT test which has been performed previously. Further, the same applies to the case where a +BT test is performed on a transistor which has been once subjected to a +BT test. Note that the same does not apply to the case where a BT test is intentionally repeated in consideration of these influences.

The variation values of the threshold voltage from the initial characteristics after the +BT test of sample 1, sample 2, and sample 3 were +2.57 V, −1.25 V, and +1.44 V, respectively. In addition, the variation values of the threshold voltage from the initial characteristics after the −BT test of sample 1, sample 2, and sample 3 were −6.54 V, −1.03 V, and −0.19 V, respectively.

Note that the variations in the threshold voltage of the transistors of samples 1 to 3 in the BT test were an irreversible change in which the threshold voltage did not return to the initial characteristics after the BT test.

It is found from FIGS. 2A and 2B, FIGS. 3A and 3B, FIGS. 4A and 4B, and FIGS. 5A and 5B that almost no variation in the variation values of the threshold voltage of samples 1 to 3 is seen in a wavelength region of around 408 nm or more corresponding to 3.15 eV which is a band gap of an In—Ga—Zn—O film used as an oxide semiconductor layer. Further, it can be said that the variation in the threshold voltage is not large as described in Non-Patent Document 1, and the variation in the threshold voltage is decreased although variation values (ΔVth) of the threshold voltage are increased in a wavelength region around 408 nm or less corresponding to a band gap of 3.15 eV.

In addition, the variation values of the threshold voltage of sample 1, sample 2, and sample 3 decrease in that order, as dehydration or dehydrogenation treatment is performed at high heating temperature as well as evaluation by the light irradiation measurement and evaluation by the BT test. Accordingly, it is found that the electrical characteristics of the transistors are further stabilized by highly purifying the oxide semiconductor layer sufficiently at high temperature.

Figure 6:
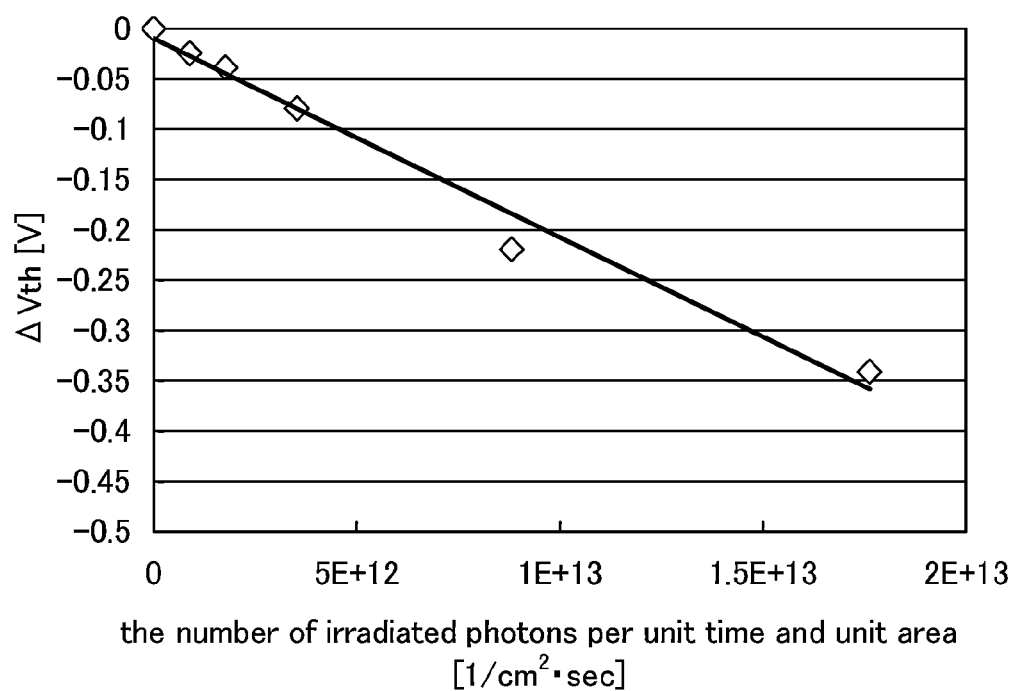
FIG. 6 is a graph showing evaluation results of electrical characteristics of a transistor of sample 3.

Next, the Vg-Id characteristics in each light irradiation intensity (energy) were measured while the transistor of sample 3 is irradiated with light from the insulating layer 114 side which is opposite side of the gate electrode 104 using a spectral sensitivity measuring apparatus. The irradiation conditions of light were as follows: the wavelength was 350 nm; the light irradiation intensity (energy) was 0 μW/cm$^2$, 0.5 μW/cm$^2$, 1 μW/cm$^2$, 2 μW/cm$^2$, 5 μW/cm$^2$, and 10 μW/cm$^2$; and the irradiation time was 90 seconds. Note that as the measurement of the Vg-Id characteristics of the transistor in sample 3 in light irradiation, a change in characteristics (Vg-Id characteristics) of the drain current (Id) was measured under conditions that the drain voltage (Vd) was set to 10 V and the gate voltage (Vg) was varied from −20 V to +20 V at room temperature, in a manner similar to that of the initial characteristics for measuring light irradiation. FIG. 6 shows the relation between the number of the irradiated photons per unit time and unit area in an irradiation wavelength of 350 nm of sample 3 and the variation values (ΔVth) of the threshold voltage. The number of irradiated photons per unit time and unit area was calculated from the light irradiation intensity (energy) using the above-described equation: the number of photons (Np)=(irradiation energy of light (E)·wavelength of light (λ))/(Planck's constant (h)·velocity of light (c)).

As illustrated in FIG. 6, the number of irradiated photons per unit time and unit area has a linear relationship with the variation values of the threshold voltage. As the number of irradiated photons increases, the variation values of the threshold voltage also increase. However, the variation values of the threshold voltage in a transistor formed using a high-purity oxide semiconductor layer are reduced to be small. Therefore, even when a large number of photons were delivered by high irradiation energy as described in Non-Patent Document 1, the variation values are not large as the variation values of the transistor of Non-Patent Document 1, and stable electrical characteristics can be obtained.

As described above, even in the case where light with a wavelength of 350 nm (or light with a wavelength greater than or equal to 400 nm and less than or equal to 410 nm) was delivered at 1×10$^{13}$ photons/cm$^2$·sec (or delivered at an intensity of 10 μW/cm$^2$ for 90 seconds), a transistor, in which an absolute value of the amount of the variation in the threshold voltage due to the irradiation of light is less than or equal to 0.65 V, preferably less than or equal to 0.55 V, can be obtained. In addition, under a similar light irradiation condition, a transistor, in which an absolute value of an amount of a variation to negative side of a shift value from an initial value is less than or equal to 3.0 V, preferably less than or equal to 2.5 V, can be obtained.

The high-purity oxide semiconductor layer 108 includes extremely small number (close to zero) of carriers and the carrier density is lower than 1×10$^{14}$/cm$^3$, preferably lower than 1×10$^{12}$/cm$^3$, more preferably lower than 1×10$^{11}$/cm$^3$.

Since the oxide semiconductor layer 108 includes extremely few carriers, off-state current can be reduced in the transistor 100. The smaller the amount of off-state current is, the better. For example, in the transistor 100 formed using the high-purity oxide semiconductor layer 108, current in an off state (off-state current) per micrometer in channel width can be reduced to less than 10 zA/μm and can be further reduced to less than 100 zA/μm at 85° C.

The structure of the transistor 100 illustrated in FIG. 1 is described in detail below. Although there is no particular limitation on a substrate used for the substrate 102 having an insulating surface, a glass substrate of barium borosilicate glass, aluminoborosilicate glass, or the like can be used.

An insulating film serving as a base film may be provided between the substrate and the gate electrode 104. The base film has a function of preventing diffusion of an impurity element from the substrate 102, and can be formed with a single-layer structure or a stacked structure including a silicon nitride film, a silicon oxide film, a silicon nitride oxide film, and/or a silicon oxynitride film.

The gate electrode 104 can be formed with a single layer or a stacked layer using a metal material such as molybdenum, titanium, chromium, tantalum, tungsten, aluminum, copper, neodymium, or scandium or an alloy material which contains any of these materials as its main component.

The gate insulating layer 106 can be formed with a single-layer structure or a stacked structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer by a plasma-enhanced CVD method, a sputtering method, or the like. For example, by a plasma-enhanced CVD method, a silicon nitride layer ($SiN_y(y>0)$) with a thickness of greater than or equal to 50 nm and less than or equal to 200 nm is formed as a first gate insulating layer, and a silicon oxide layer ($SiO_x(x>0)$) with a thickness of greater than or equal to 5 nm and less than or equal to 300 nm is formed as a second gate insulating layer over the first gate insulating layer, so that a gate insulating layer with a total thickness of 200 nm is formed.

As an oxide semiconductor used for the oxide semiconductor layer 108, an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are oxides of two metal elements; or an In—O-based oxide semiconductor, a Sn—O-based oxide semiconductor, or a Zn—O-based oxide semiconductor which are oxides of one metal element can be used. Further, $SiO_2$ may be contained in the above-described oxide semiconductor. Note that here, for example, an In—Ga—Zn—O-based oxide semiconductor means an oxide containing indium (In), gallium (Ga), and zinc (Zn), and there is no particular limitation on the stoichiometric proportion thereof. Further, the In—Ga—Zn—O-based oxide semiconductor may contain an element other than In, Ga, and Zn.

For the oxide semiconductor layer 108, a thin film, represented by the chemical formula, $InMO_3(ZnO)_m(m>0)$ can be used. Here, M represents one or more metal elements selected from Ga, Al, Mn, and Co. For example, M can be Ga, Ga and Al, Ga and Mn, Ga and Co, or the like.

For a conductive film used for the source electrode 110 and the drain electrode 112, for example, a metal film including an element selected from Al, Cr, Cu, Ta, Ti, Mo, and W; a metal nitride film including any of these elements as a component (a titanium nitride film, a molybdenum nitride film, or a tungsten nitride film); or the like can be used. Alternatively, a structure may be employed in which a film of a high-melting-point metal such as Ti, Mo, or W or a metal nitride film of any of these (a titanium nitride film, a molybdenum nitride film, or a tungsten nitride film) is stacked over and/or below a metal film of Al, Cu, or the like.

The conductive film to be the source electrode 110 and the drain electrode 112 (including a wiring layer formed in the same layer as the source electrode 110 and the drain electrode 112) may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials in which silicon oxide is contained can be used.

As the insulating layer 114 provided above the oxide semiconductor layer, typically, an inorganic insulating film such as a silicon oxide film, a silicon oxynitride film, an aluminum oxide film, or an aluminum oxynitride film can be used.

A protective insulating layer may be provided above the oxide semiconductor layer. As the protective insulating layer, an inorganic film such as a silicon nitride film, an aluminum nitride film, a silicon nitride oxide film, or an aluminum nitride oxide film can be used.

A planarization insulating film may be formed over the protective insulating layer in order to reduce surface roughness caused by a transistor. As the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed from these materials.

As described above, in a transistor including a high-purity oxide semiconductor layer by intentionally eliminating an impurity such as hydrogen, moisture, hydroxyl, or hydride (also referred to as a hydrogen compound) from an oxide semiconductor layer, the variation in electrical characteristics of the transistor due to light irradiation is suppressed and the transistor is electrically stable. Therefore, a highly reliable semiconductor device can be provided.

Embodiment 2

An example of a transistor having an operation effect which is similar to that of the transistor described in Embodiment 1 will be described with reference to drawings. The same portion as or a portion having a function similar to those in the above-described embodiment can be formed in a manner similar to that described in the above-described embodiment, and also the steps similar to those in the above-described embodiment can be performed in a manner similar to that described in the above-described embodiment, and repetitive description is omitted. In addition, detailed description of the same portions is not omitted.

When an oxide semiconductor in which the level in a gap and the band tail state are reduced is used, there is no particular limitation on a structure of a transistor in which the effect of light irradiation can be reduced. For example, a top gate structure in which a gate electrode is provided in the upper part of an oxide semiconductor layer with a gate insulating layer interposed therebetween, or a bottom gate structure in which a gate electrode is provided in the lower part of an oxide semiconductor layer with a gate insulating layer interposed therebetween, such as a staggered structure or a planar structure can be used. As a staggered transistor, a bottom gate structure in which a protective layer is provided over a channel formation region, which is referred to as a channel protective type (also referred to as channel-stop type), may also be used.

The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel region with a gate insulating layer provided therebetween.

An example of a method for manufacturing a transistor including an oxide semiconductor layer will be described in detail with reference to FIGS. 7A to 7E.

FIGS. 7A to 7E illustrate an example of a cross-sectional structure of a transistor. The transistor 100 illustrated in FIGS. 7A to 7E is an inverted staggered transistor having a bottom gate structure, which is similar to the transistor 100 illustrated in FIG. 1. A process of manufacturing the transistor 100 over the substrate 102 will be described below with reference to FIGS. 7A to 7E.

After a conductive film is formed over the substrate 102 having an insulating surface, the gate electrode 104 is formed in a first photolithography step. Note that a resist mask may be formed by an ink-jet method. Formation of the resist mask by an ink-jet method needs no photomask; thus, manufacturing cost can be reduced.

As the substrate 102 having an insulating surface, a substrate similar to the substrate 102 described in Embodiment 1 can be used.

An insulating film serving as a base film may be provided between the substrate 102 and the gate electrode 104. The base film has a function of preventing diffusion of an impurity element from the substrate 102, and can be formed with a single-layer structure or a stacked structure including a silicon nitride film, a silicon oxide film, a silicon nitride oxide film, and/or a silicon oxynitride film.

The gate electrode 104 can be formed to have a single-layer structure or a stacked structure using a metal material such as molybdenum, titanium, tantalum, tungsten, aluminum, copper, neodymium, or scandium, or an alloy material which includes any of these materials as a main component.

The gate insulating layer 106 is formed over the gate electrode 104. The gate insulating layer 106 can be formed with a single-layer structure or a stacked structure using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer by a plasma-enhanced CVD method, a sputtering method, or the like.

As another method for forming the gate insulating layer 106, a high-density plasma-enhanced CVD method using microwaves (e.g., a frequency of 2.45 GHz) is preferably adopted because an insulating layer can be dense and can have high withstand voltage and high quality. The high-purity oxide semiconductor and the high-quality gate insulating layer are in close contact with each other, whereby the interface state can be reduced to obtain favorable interface characteristics.

Needless to say, another film formation method such as a sputtering method or a plasma-enhanced CVD method can be employed as long as the method enables formation of a good-quality insulating layer as a gate insulating layer. Further, an insulating layer whose film quality and characteristic of the interface between the insulating layer and an oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer.

Further, in order that hydrogen, hydroxyl, and moisture may be contained in the gate insulating layer 106 and an oxide semiconductor film 107 as little as possible, it is preferable that the substrate 102 over which the gate electrode 104 is formed or the substrate 102 over which layers up to and including the gate insulating layer 106 are formed be preheated in a preheating chamber of a sputtering apparatus as pretreatment for the formation of the oxide semiconductor film 107 so that impurities such as hydrogen and moisture adsorbed to the substrate 102 are eliminated and removed. As an exhaustion unit provided in the preheating chamber, a cryopump is preferable. Note that this preheating treatment can be omitted. Further, this preheating may be similarly performed on the substrate 102 over which layers up to and including the source electrode 110 and the drain electrode 112 are formed, before the formation of the insulating layer 114.

Figure 7A:
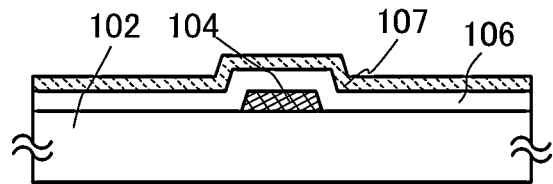
FIGS. 7A to 7E are cross-sectional views illustrating one embodiment of a method for manufacturing a semiconductor device.
Figure 7B:
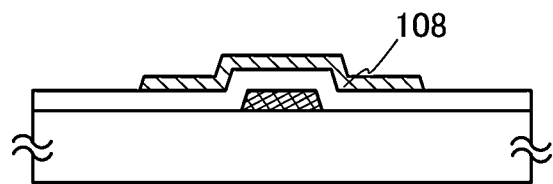

Next, the oxide semiconductor film 107 having a thickness of greater than or equal to 2 nm and less than or equal to 200 nm, preferably greater than or equal to 5 nm and less than or equal to 30 nm is formed over the gate insulating layer 106 (see FIG. 7A). As the oxide semiconductor, an oxide semiconductor which is made to be an i-type or substantially i-type by removing impurities is used.

Before the oxide semiconductor film 107 is formed by a sputtering method, powdery substances (also referred to as particles or dust) which are attached on a surface of the gate insulating layer 106 are preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

As an oxide semiconductor used for the oxide semiconductor film 107, the oxide semiconductor described in Embodiment 1 can be used. Further, $SiO_2$ may be contained in the above-described oxide semiconductor. In this embodiment, the oxide semiconductor film 107 is deposited by a sputtering method with the use of an In—Ga—Zn—O-based oxide semiconductor target. A cross-sectional view at this stage is illustrated in FIG. 7A. Alternatively, the oxide semiconductor film 107 can be formed by a sputtering method in a rare gas (typically, argon) atmosphere, an oxygen atmosphere, or a mixed atmosphere of a rare gas and oxygen.

The target for forming the oxide semiconductor film 107 by a sputtering method is, for example, an oxide target containing $In_2O_3$, $Ga_2O_3$, and ZnO in a composition ratio [molar ratio] of 1 to 1 to 1 to form an In—Ga—Zn—O film. Without limitation to the material and the component of the target, for example, an oxide target containing $In_2O_3$, $Ga_2O_3$, and ZnO at 1:1:2 [molar ratio] may be used.

The filling rate of the oxide target is greater than or equal to 90% and less than or equal to 100%, preferably greater than or equal to 95% and less than or equal to 99.9%. With the use of the metal oxide target with high filling rate, a dense oxide semiconductor film is formed.

It is preferable that a high-purity gas in which an impurity such as hydrogen, water, hydroxyl, or hydride is removed be used as the sputtering gas for the deposition of the oxide semiconductor film 107.

The substrate is placed in a deposition chamber under reduced pressure, and the substrate temperature is set at higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. Then, residual moisture in the deposition chamber is removed, a sputtering gas from which hydrogen and moisture are removed is introduced, and the above-described target is used, so that the oxide semiconductor film 107 is formed over the substrate 102. In order to remove the residual moisture in the deposition chamber, an entrapment vacuum pump, for example, a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of impurities in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Then, the oxide semiconductor film 107 is processed into an island-shaped oxide semiconductor layer in a second photolithography step. A resist mask for forming the island-shaped oxide semiconductor layer may be formed by an ink-jet method. Formation of the resist mask by an ink-jet method needs no photomask; thus, manufacturing cost can be reduced.

For the etching of the oxide semiconductor film 107, either or both of wet etching and dry etching may be employed. For example, as an etchant used for wet etching of the oxide semiconductor film 107, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. In addition, ITO07N (produced by KANTO CHEMICAL CO., INC.) may also be used.

Next, the oxide semiconductor layer is subjected to dehydration or dehydrogenation treatment. By the first heat treatment, the oxide semiconductor layer can be dehydrated or dehydrogenated. The temperature of the first heat treatment is higher than or equal to 400° C. and lower than or equal to 750° C., or higher than or equal to 400° C. and lower than the strain point of the substrate. In this embodiment, the substrate is put in an electric furnace that is a kind of heat treatment apparatus and first heat treatment is performed on the oxide semiconductor layer at 450° C. in a nitrogen atmosphere for one hour, and then water and hydrogen are prevented from entering the oxide semiconductor layer with the oxide semiconductor layer not exposed to air; thus, the oxide semiconductor layer 108 is obtained (see FIG. 7B).

The apparatus for the heat treatment is not limited to the electric furnace and may be the one provided with a device for heating an object to be processed, using heat conduction or heat radiation from a heating element such as a resistance heating element. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, an inert gas which does not react with an object to be treated by heat treatment, such as nitrogen or a rare gas like argon, is used.

For example, as the first heat treatment, GRTA by which the substrate is moved into an inert gas heated to a high temperature as high as 650° C. to 700° C., heated for several minutes, and moved out of the inert gas heated to the high temperature may be performed.

Note that in the first heat treatment, it is preferable that water, hydrogen, and the like be not contained in nitrogen or a rare gas such as helium, neon, or argon in an atmosphere. Alternatively, it is preferable that the purity of nitrogen or the rare gas such as helium, neon, or argon which is introduced into a heat treatment apparatus be set to be 6N (99.9999%) or more, preferably 7N (99.99999%) or more (i.e., the impurity concentration is 1 ppm or less, preferably 0.1 ppm or less).

After the oxide semiconductor layer is heated in the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is 1 ppm or less, preferably 0.1 ppm or less). By the effect of the oxygen gas or the $N_2O$ gas, oxygen which is a main component included in the oxide semiconductor and which has been reduced at the same time as the step for removing impurities by dehydration or dehydrogenation is supplied, so that the oxide semiconductor layer can be a high-purity and electrically i-type (intrinsic) oxide semiconductor.

The first heat treatment on the oxide semiconductor layer can be performed on the oxide semiconductor film 107 before processed into the island-shaped oxide semiconductor layer. In that case, the substrate is taken out from the heat apparatus after the first heat treatment, and then a photolithography step is performed.

Note that the first heat treatment may be performed at either of the following timings without limitation to the above-described timing as long as it is performed after the oxide semiconductor layer is formed: after a source electrode layer and a drain electrode layer are formed over the oxide semiconductor layer; and after an insulating layer is formed over the source electrode layer and the drain electrode layer.

Through the above process, impurities such as moisture or hydrogen in the oxide semiconductor layer 108 can be reduced and the oxide semiconductor layer can be highly purified. Impurities such as moisture or hydrogen are eliminated, and the oxide semiconductor layer 108 becomes an i-type (intrinsic) semiconductor or close to a substantially i-type semiconductor; therefore, deterioration of characteristics of the transistor due to light irradiation, such as variations in threshold voltage, can be prevented from being promoted and stable electrical characteristics can be provided.

Next, a conductive film to be a source electrode layer and a drain electrode layer (including a wiring formed in the same layer as the source electrode layer and the drain electrode layer) is formed over the gate insulating layer 106 and the oxide semiconductor layer 108. As the conductive film used for the source electrode layer and the drain electrode layer, the material used for the source electrode 110 and the drain electrode 112 which is described in Embodiment 1 can be used. Tungsten nitride, titanium nitride, or tantalum nitride is preferably used as a material for an electrode, which can form a good contact interface without a reaction of extracting oxygen from the oxide semiconductor layer. Since the work function of tungsten nitride is lower than the electron affinity of the oxide semiconductor, a Schottky barrier to electrons is not formed; therefore, tungsten nitride is one of preferable materials for an electrode.

Figure 7C:
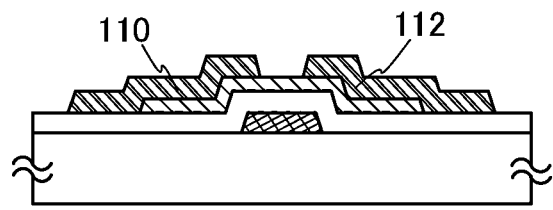
Figure 7D:
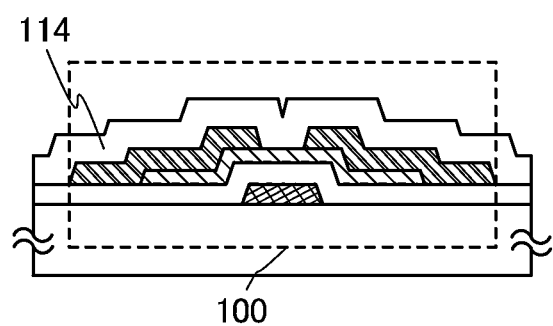
Figure 7E:
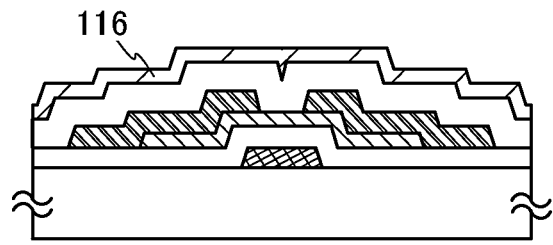

In a third photolithography step, a resist mask is formed over the conductive film and the conductive film is selectively etched, so that the source electrode 110 and the drain electrode 112 are formed; then the resist mask is removed (see FIG. 7C).

Light exposure at the time of the formation of the resist mask in the third photolithography step may be performed using ultraviolet light, KrF laser light, or ArF laser light. A channel length L of a transistor to be formed later is determined by a distance between bottom ends of the source electrode layer and the drain electrode layer, which are adjacent to each other over the oxide semiconductor layer 108. Note that in the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. For these reasons, the channel length L of the transistor to be formed later can be 10 nm to 1000 nm, inclusive, and the circuit can operate at higher speed.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor layer 108 when the conductive film is etched. However, it is difficult to obtain etching conditions in which only the conductive film is etched and the oxide semiconductor layer 108 is not etched at all. In some cases, only part of the oxide semiconductor layer 108 is etched to be an oxide semiconductor layer having a groove portion (a recessed portion) when the conductive film is etched.

Next, by plasma treatment using a gas such as $N_2O$, $N_2$, or Ar, water or the like adsorbed to a surface of an exposed portion of the oxide semiconductor layer may be removed. In the case where the plasma treatment is performed, the insulating layer 114 is formed without exposure to the air as a protective insulating film in contact with part of the oxide semiconductor layer.

The insulating layer 114 has a thickness of at least 1 nm or more and can be formed by a method by which an impurity such as water or hydrogen does not enter the insulating layer 114, such as a sputtering method, as appropriate. When hydrogen is contained in the insulating layer 114, entry of the hydrogen to the oxide semiconductor layer or extraction of oxygen in the oxide semiconductor layer by the hydrogen is caused, thereby making the resistance of the back channel of the oxide semiconductor layer low (n-type), so that a parasitic channel could be formed. Therefore, it is important that a film formation method in which hydrogen is not used be employed in order to form the insulating layer 114 containing as little hydrogen as possible.

For example, a silicon oxide film is formed to a thickness of 200 nm as the insulating layer 114 by a sputtering method. The substrate temperature in film formation may be higher than or equal to room temperature and lower than or equal to 300° C., and in this embodiment, is 100° C. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen. As the insulating layer 114 which is formed in contact with the oxide semiconductor layer, an inorganic insulating film which does not contain an impurity such as moisture, a hydrogen ion, and $OH^-$ and blocks entry of these from the outside is used. Typically, a silicon oxide film, a silicon oxynitride film, an aluminum oxide film, an aluminum oxynitride film, or the like is used.

As in the case of forming the oxide semiconductor film 107, an entrapment vacuum pump (such as a cryopump) is preferably used in order to remove residual moisture in the deposition chamber of the insulating layer 114. When the insulating layer 114 is deposited in the deposition chamber evacuated using a cryopump, the concentration of impurities in the insulating layer 114 can be reduced. In addition, as an exhaustion unit for removing the residual moisture in the deposition chamber of the insulating layer 114, a turbo pump provided with a cold trap may be used.

It is preferable that a high-purity gas in which an impurity such as hydrogen, water, hydroxyl, or hydride is removed be used as the sputtering gas for the deposition of the insulating layer 114.

Next, a second heat treatment is performed, preferably in an inert gas atmosphere or oxygen gas atmosphere (preferably at 200° C. to 400° C., inclusive, e.g., 250° C. to 350° C., inclusive). For example, the second heat treatment is performed at 250° C. in a nitrogen atmosphere for one hour. The second heat treatment performs heating while part (a channel formation region) of the oxide semiconductor layer is in contact with the insulating layer 114.

Through the above process, the heat treatment is performed on the oxide semiconductor film so that an impurity such as hydrogen, moisture, hydroxyl, or hydride (also referred to as a hydrogen compound) is intentionally removed from the oxide semiconductor layer. Additionally, oxygen which is one of main components of an oxide semiconductor and is simultaneously reduced in a step of removing an impurity can be supplied. Accordingly, the oxide semiconductor layer is highly purified to be an electrically i-type (intrinsic) semiconductor. Through the above process, the transistor 100 is formed (see FIG. 7D).

When a silicon oxide layer having a lot of defects is used as the insulating layer 114, with the heat treatment which is performed after the formation of the silicon oxide layer, impurities such as hydrogen, moisture, hydroxyl, or hydride contained in the oxide semiconductor layer can be diffused to the oxide insulating layer so that the impurities in the oxide semiconductor layer can be further reduced.

A protective insulating layer 116 may be additionally formed over the insulating layer 114. For example, a silicon nitride film is formed by an RF sputtering method. Since an RF sputtering method has high productivity, it is preferably used as a film formation method of the protective insulating layer. As the protective insulating layer, an inorganic insulating film which does not contain an impurity such as moisture and prevents entry of these from the outside, such as a silicon nitride film or an aluminum nitride film is used. In this embodiment, the protective insulating layer 116 is formed using a silicon nitride film (see FIG. 7E).

For example, as the protective insulating layer 116, a silicon nitride film is formed by heating the substrate 102 over which layers up to and including the insulating layer 114 are formed, to a temperature of 100° C. to 400° C., introducing a sputtering gas containing high-purity nitrogen from which hydrogen and moisture are removed, and using a target of a silicon semiconductor. In this step also, it is preferable that the protective insulating layer 116 be formed while residual moisture in the process chamber is removed as in the case of the insulating layer 114.

After the formation of the protective insulating layer, heat treatment may be further performed at a temperature of 100° C. to 200° C., inclusive in the air for one hour to 30 hours, inclusive. This heat treatment may be performed at a fixed heating temperature. Alternatively, the following change in the heating temperature may be conducted plural times repeatedly: the heating temperature is increased from a room temperature to a temperature of 100° C. to 200° C., inclusive and then decreased to a room temperature.

As described above, in a transistor including an oxide semiconductor layer purified by intentionally eliminating an impurity such as hydrogen, moisture, hydroxyl, or hydride (also referred to as a hydrogen compound) from an oxide semiconductor layer, the variation in electrical characteristics of the transistor due to light irradiation is suppressed and the transistor is electrically stable. Therefore, a highly reliable semiconductor device can be provided.

Embodiment 3

A display device including the transistor an example of which is described in Embodiment 1 or Embodiment 2 can be manufactured. Moreover, some or all of the driver circuits which include the transistor can be formed over a substrate where the pixel portion is formed, whereby a system-on-panel can be obtained.

Figure 8A:
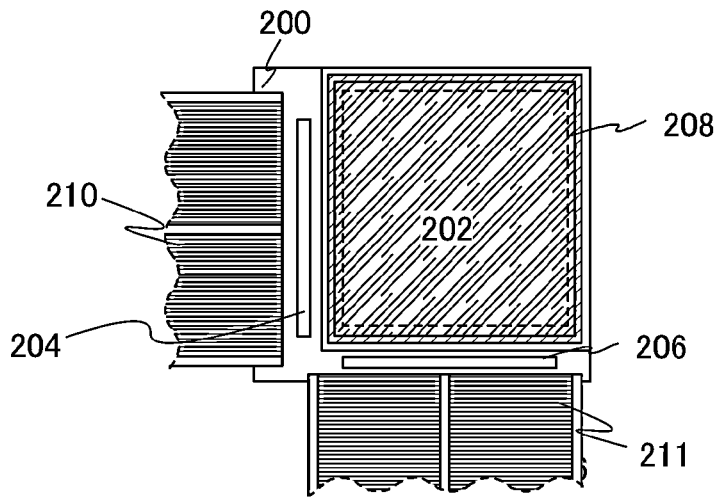
FIGS. 8A to 8C are top views each illustrating one embodiment of a semiconductor device.

In FIG. 8A, a sealant 208 is provided so as to surround a pixel portion 202 provided over a first substrate 200, and the pixel portion 202 is sealed between the first substrate 200 and a second substrate 212. In FIG. 8A, a scan line driver circuit 206 and a signal line driver circuit 204 which are formed using a single crystal semiconductor film or a polycrystalline semiconductor film over a substrate separately prepared are mounted in a region that is different from the region surrounded by the sealant 208 over the first substrate 200. Various signals and potentials are supplied to the signal line driver circuit 204 and the scan line driver circuit 206 each of which is separately formed, and the pixel portion 202 from flexible printed circuits (FPCs) 210 and 211.

Figure 8B:
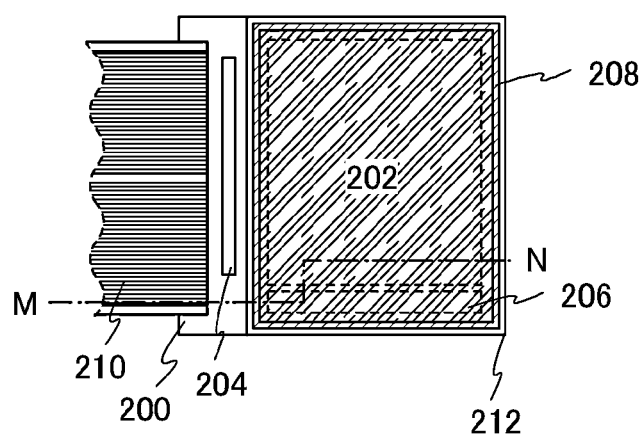
Figure 8C:
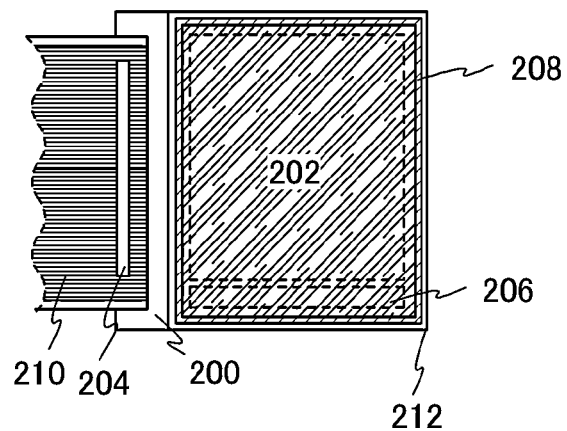

In FIGS. 8B and 8C, the sealant 208 is provided so as to surround the pixel portion 202 and the scan line driver circuit 206 which are provided over the first substrate 200. The second substrate 212 is provided over the pixel portion 202 and the scan line driver circuit 206. Consequently, the pixel portion 202 and the scan line driver circuit 206 are sealed together with the display element, by the first substrate 200, the sealant 208, and the second substrate 212. In FIGS. 8B and 8C, the signal line driver circuit 204 which is formed using a single crystal semiconductor film or a polycrystalline semiconductor film over a substrate separately prepared is mounted in a region that is different from the region surrounded by the sealant 208 over the first substrate 200. In FIGS. 8B and 8C, various signals and potentials are supplied to the signal line driver circuit 204 which is separately formed, the scan line driver circuit 206, and the pixel portion 202 from the FPC 210.

Although FIGS. 8B and 8C each illustrate the example in which the signal line driver circuit 204 is formed separately and mounted on the first substrate 200, one embodiment of the present invention is not limited to this structure. The scan line driver circuit may be separately formed and then mounted, or only part of the signal line driver circuit or part of the scan line driver circuit may be separately formed and then mounted.

Note that there is no particular limitation on the connection method of the driver circuit which is separately formed, and a chip on glass (COG) method, a wire bonding method, a tape automated bonding (TAB) method, or the like can be used. FIG. 8A illustrates an example in which the signal line driver circuit 204 and the scan line driver circuit 206 are mounted by a COG method. FIG. 8B illustrates an example in which the signal line driver circuit 204 is mounted by a COG method. FIG. 8C illustrates an example in which the signal line driver circuit 204 is mounted by a TAB method.

A display device includes a panel in which a display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors and the transistor an example of which is described in Embodiment 1 or Embodiment 2 can be used as one of the transistors.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric action, such as electronic ink, can be used.

Figure 9:
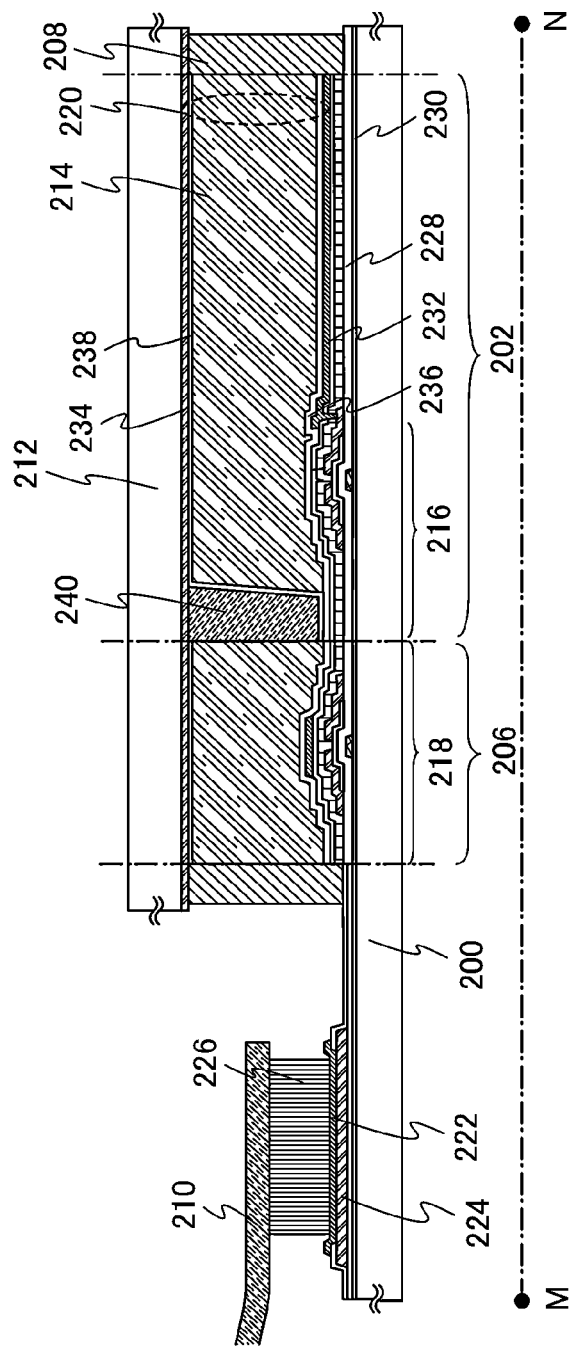
FIG. 9 is a cross-sectional view illustrating one embodiment of a semiconductor device.
Figure 10:
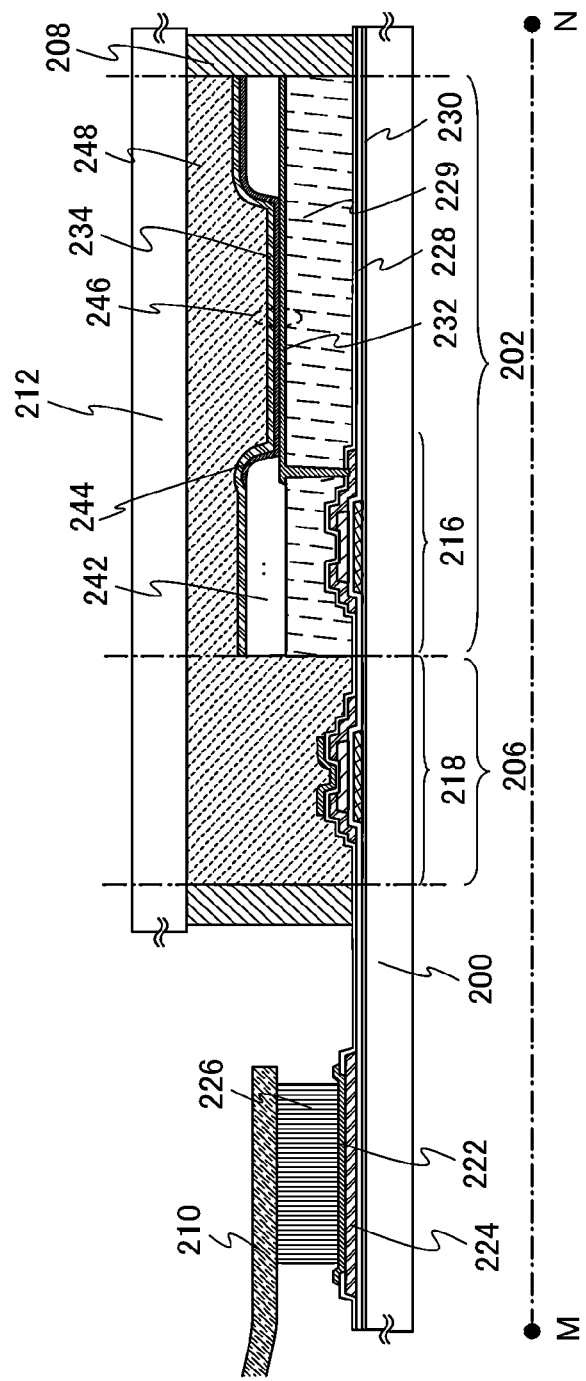
FIG. 10 is a cross-sectional view illustrating one embodiment of a semiconductor device.
Figure 11:
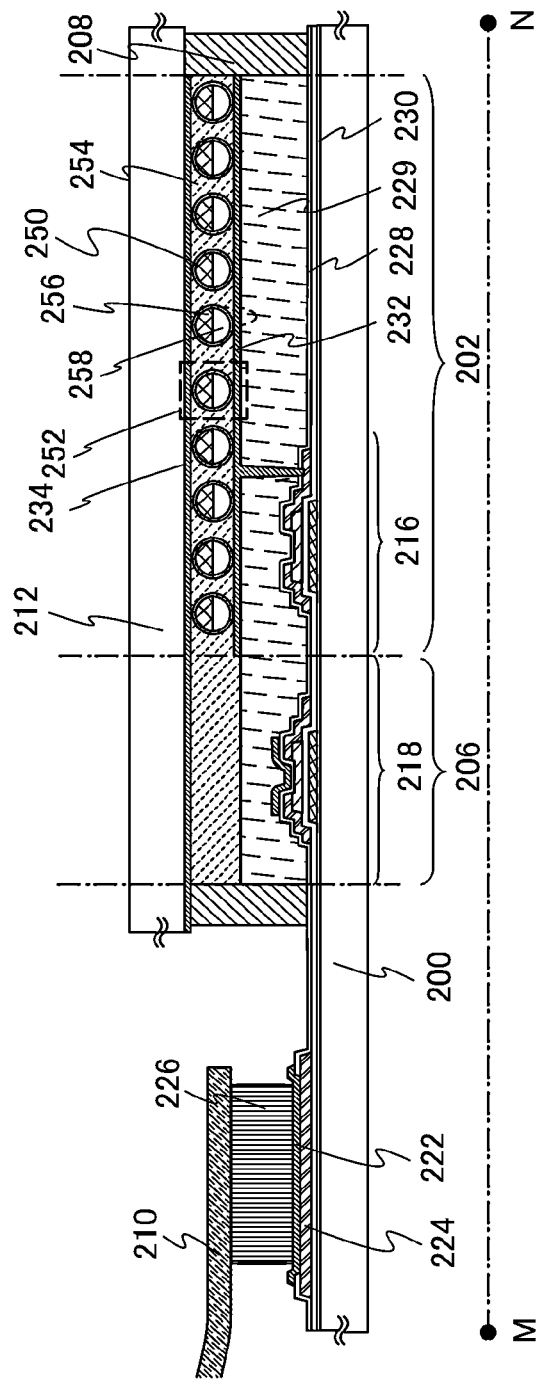
FIG. 11 is a cross-sectional view illustrating one embodiment of a semiconductor device.

One embodiment of a display device will be described with reference to FIG. 9, FIG. 10, and FIG. 11. FIG. 9, FIG. 10, and FIG. 11 correspond to cross-sectional views along line M-N in FIG. 8B.

As illustrated in FIG. 9, FIG. 10, and FIG. 11, the semiconductor device includes a connection terminal electrode 222 and a terminal electrode 224, and the connection terminal electrode 222 and the terminal electrode 224 are electrically connected to a terminal included in the FPC 210 through an anisotropic conductive film 226.

The connection terminal electrode 222 is formed using the same conductive film as a first electrode layer 232, and the terminal electrode 224 is formed using the same conductive film as each of source and drain electrode layers included in transistors 216 and 218.

The pixel portion 202 and the scan line driver circuit 206 provided over the first substrate 200 each include a plurality of transistors. FIG. 9, FIG. 10, and FIG. 11 each illustrate the transistor 216 included in the pixel portion 202 and the transistor 218 included in the scan line driver circuit 206. An insulating layer 228 is provided over the transistors 216 and 218 in FIG. 9, and an insulating layer 229 is further provided in FIG. 10 and FIG. 11. Note that an insulating film 230 is an insulating film functioning as a base film.

As the transistors 216 and 218, the transistor described in Embodiment 1 or Embodiment 2 can be used.

In a transistor including an oxide semiconductor layer purified by intentionally eliminating an impurity such as hydrogen, moisture, hydroxyl, or hydride (also referred to as a hydrogen compound) from the oxide semiconductor layer, the variation in electrical characteristics of the transistor due to light irradiation is suppressed and the transistor is electrically stable.

Accordingly, characteristics of a transistor are stable even when the transistor is provided in a display device or the like which is used in a place irradiated with light, whereby a highly reliable display device can be provided. That is, even when a transistor in which an oxide semiconductor layer is used for a channel formation region is used, the variation in the threshold voltage due to light irradiation can be suppressed; accordingly, the operation of the display device in which the transistor is used for a pixel portion can be stabilized. In other words, even when a transistor of a pixel is irradiated with light from an illumination light source in a display device utilizing the electro-optical effect of liquid crystal, the threshold voltage of the transistor is not greatly changed, whereby display of an image can be performed well.

In this embodiment, an example is described in which a conductive layer is provided over an insulating layer so as to overlap with a channel formation region of an oxide semiconductor layer in the transistor 218 for the driver circuit portion. By providing the conductive layer so as to overlap with the channel formation region of the oxide semiconductor layer, the amount of change in the threshold voltage of the transistor 218 between before and after the BT test can be further reduced. In addition, the conductive layer may have the same potential as or a potential different from that of a gate electrode layer of the transistor 218 and can function as a second gate electrode layer. Alternatively, the potential of the conductive layer may be GND, 0V, or in a floating state.

The conductive layer functions to block external electric field (particularly, block static electricity), that is, to prevent external electric field from acting the inside (a circuit portion including the thin film transistor). A blocking function of the conductive layer can prevent the variation in electrical characteristics of the transistor due to the effect of external electric field such as static electricity.

In the display panel, the transistor 216 included in the pixel portion 202 is electrically connected to a display element. There is no particular limitation on the kind of the display element as long as display can be performed, and a variety of display elements can be used as the display element.

Note that an example of a liquid crystal display device using a liquid crystal element as a display element is described in FIG. 9. In FIG. 9, a liquid crystal element 220 which is a display element includes the first electrode layer 232, a second electrode layer 234, and a liquid crystal layer 214. Note that an insulating film 236 and an insulating film 238 serving as alignment films are provided to hold the liquid crystal layer 214 therebetween. The second electrode layer 234 is provided on the second substrate 212 side, and the first electrode layer 232 and the second electrode layer 234 are stacked with the liquid crystal layer 214 provided therebetween.

A spacer 240 is obtained by selectively etching an insulating film and is provided in order to control the thickness of the liquid crystal layer 214 (a cell gap). Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor which uses an oxide semiconductor layer particularly has a possibility that electrical characteristics of the transistor may change significantly by the influence of static electricity and deviate from the designed range. Therefore, it is more effective to use a liquid crystal material exhibiting a blue phase for the liquid crystal display device including a transistor which uses an oxide semiconductor layer.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. Since the transistor including a high-purity oxide semiconductor layer is used as the transistor, a storage capacitor having capacitance which is less than or equal to ⅓, preferably less than or equal to ⅕ with respect to the liquid crystal capacitance of each pixel is sufficient to be provided.

For a liquid crystal mode, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

In addition, a normally black liquid crystal display device such as a transmissive liquid crystal display device utilizing a vertical alignment (VA) mode is preferable. For example, a multi-domain vertical alignment (MVA) mode, a patterned vertical alignment (PVA) mode, an ASV mode, or the like can be employed. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Note that the sizes of display regions may be different between respective dots of color elements. Note also that the present invention is not limited to the application to a display device for color display but can also be applied to a display device for monochrome display.

As the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined; thus, the light-emitting organic compound is excited. The light-emitting organic compound returns to a ground state from the excited state, thereby emitting light. Owing to such a mechanism, this light-emitting element is referred to as a current-excitation light-emitting element.

In order to extract light emitted from the light-emitting element, it is acceptable as long as at least one of a pair of electrodes is transparent. Then, a transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be applied.

An example of a light-emitting device in which a light-emitting element is used as a display element will be illustrated in FIG. 10. A light-emitting element 246 which is a display element is electrically connected to the transistor 216 provided in the pixel portion 202. Note that a structure of the light-emitting element 246 is a stacked structure of the first electrode layer 232, an electroluminescent layer 244, and the second electrode layer 234, but there is no limitation on the structure described here. The structure of the light-emitting element 246 can be changed as appropriate depending on a direction in which light is extracted from the light-emitting element 246, or the like.

A partition 242 is formed using an organic insulating material or an inorganic insulating material. It is particularly preferable that the partition be formed using a photosensitive resin material to have an opening portion over the first electrode layer 232 so that a sidewall of the opening portion is formed as a tilted surface with continuous curvature.

The electroluminescent layer 244 may be formed with a single layer or a plurality of layers stacked.

A protective film may be formed over the second electrode layer 234 and the partition 242 in order to prevent oxygen, hydrogen, moisture, carbon dioxide, or the like from entering into the light-emitting element 246. As the protective film, a silicon nitride film, a silicon nitride oxide film, a DLC film, or the like can be formed. Further, a filler 248 is provided in a space sealed with the first substrate 200, the second substrate 212, and the sealant 208 so as to seal closely. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 248, an ultraviolet curable resin or a thermosetting resin can be used in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

As needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high-dielectric constant moves to a high-electric field region.

A solution in which the above-described microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device in which a twisting ball display method is employed can be used. The twisting ball display method refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates active matrix electronic paper as one embodiment of a semiconductor device. The electronic paper in FIG. 11 is an example of a display device using a twisting ball display method. The twisting ball display method refers to a method in which spherical particles each colored in black and white are arranged between electrode layers included in a display element, and a potential difference is generated between the electrode layers to control the orientation of the spherical particles, so that display is performed.

Between the first electrode layer 232 connected to the transistor 216 and the second electrode layer 234 provided for the second substrate 212, spherical particles 252 each of which includes a black region 256, a white region 258, and a cavity 250 which is filled with liquid around the black region 256 and the white region 258, are provided. A space around the spherical particles 252 is filled with a filler 254 such as a resin. The second electrode layer 234 corresponds to a common electrode (counter electrode). The second electrode layer 234 is electrically connected to a common potential line.

As the first substrate 200 and the second substrate 212 in FIG. 9, FIG. 10, and FIG. 11, a flexible substrate can be used, and for example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 228 functions as a protective film of a transistor. Note that the protective film is provided to prevent entry of contamination impurities floating in air, such as an organic substance, a metal substance, or moisture, and is preferably a dense film. The protective film may be formed with a single-layer structure or a stacked structure using a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method.

The insulating layer 229 functioning as a planarization insulating film can be formed using an organic material having heat resistance, such as acrylic, polyimide, benzocyclobutene, polyamide, or epoxy. Other than such organic materials, it is also possible to use a low-dielectric constant material (a low-k material), a siloxane-based resin, phosphosilicate glass (PSG), borophosphosilicate glass (BPSG), or the like. Note that the insulating layer may be formed by stacking a plurality of insulating films formed of these materials.

There is no particular limitation on the formation method of the insulating layer 228 and the insulating layer 229, and the following method can be employed depending on the material: a method such as a sputtering method, an SOG method, spin coating, dip coating, spray coating, or a droplet discharge method (e.g., an ink-jet method, screen printing, or offset printing), or with a tool (equipment) such as a doctor knife, a roll coater, a curtain coater, or a knife coater.

Any of the transistors described in Embodiment 1 or Embodiment 2 is used for the display device which is described above, whereby the display device can have a variety of functions.

Embodiment 4

A semiconductor device having an image sensor function for reading out information of an object can be formed using the transistor an example of which is described in Embodiment 1 or Embodiment 2.

Figure 12A:
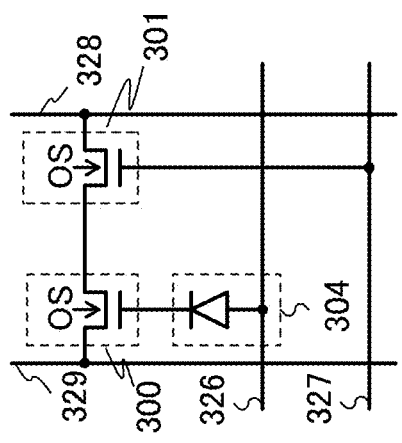
FIGS. 12A and 12B each illustrate one embodiment of a semiconductor device.

An example of a semiconductor device having an image sensor function is illustrated in FIG. 12A. FIG. 12A is an equivalent circuit of a pixel of an image sensor, and FIG. 12B is a cross-sectional view of part of the image sensor.

One electrode of a photodiode 304 is electrically connected to a conductive layer 326 functioning as a photodiode reset signal line, and the other electrode of the photodiode 304 is electrically connected to a gate of a transistor 300. One of a source and a drain of the transistor 300 is electrically connected to a photosensor reference signal line 329, and the other of the source and the drain of the transistor 300 is electrically connected to one of a source and a drain of a transistor 301. A gate of the transistor 301 is electrically connected to a gate signal line 327, and the other of the source and the drain of the transistor 301 is electrically connected to a photosensor output signal line 328.

Note that in the circuit diagram in FIG. 12A, a transistor including an oxide semiconductor layer is denoted by a symbol "OS" so that it can be identified as a transistors including an oxide semiconductor layer. The transistor 300 and the transistor 301 in FIG. 12A are transistors each including an oxide semiconductor layer.

Figure 12B:
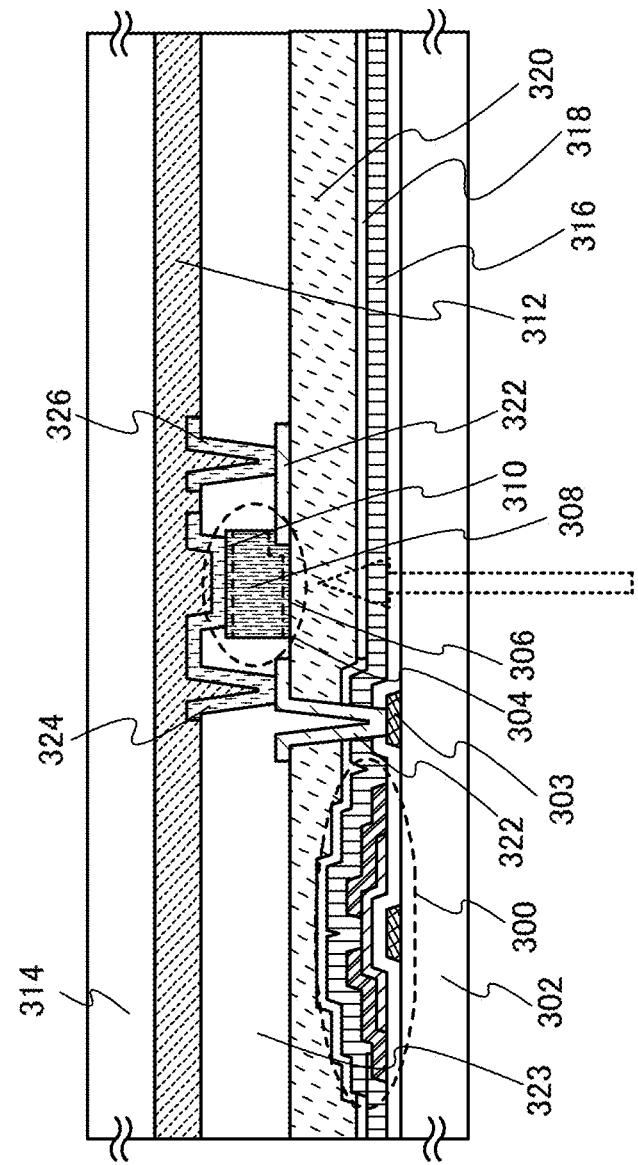

FIG. 12B is a cross-sectional view of a structure of the photodiode 304 and the transistor 300. The photodiode 304 functioning as a sensor and the transistor 300 are provided over a substrate 302 having an insulating surface (TFT substrate). A substrate 314 is provided over the photodiode 304 and the transistor 300 using an adhesive layer 312.

An insulating layer 316, a protective insulating layer 318, an interlayer insulating layer 320, and an interlayer insulating layer 323 are provided over the transistor 300. The photodiode 304 is provided over the interlayer insulating layer 320.

In the photodiode 304, a first semiconductor layer 306, a second semiconductor layer 308, and a third semiconductor layer 310 are stacked in that order over the interlayer insulating layer 320 between an electrode layer 322 formed over the interlayer insulating layer 320 and an electrode layer 324 formed over the interlayer insulating layer 323.

The electrode layer 322 is electrically connected to the conductive layer 326 which is formed in the interlayer insulating layer 323, and the electrode layer 324 is electrically connected to a gate electrode layer 303 through the electrode layer 322. The gate electrode layer 303 is electrically connected to a gate electrode layer of the transistor 300, and the photodiode 304 is electrically connected to the transistor 300.

Here, a pin photodiode in which a semiconductor layer having p-type conductivity as the first semiconductor layer 306, a high-resistance semiconductor layer (i-type semiconductor layer) as the second semiconductor layer 308, and a semiconductor layer having n-type conductivity as the third semiconductor layer 310 are stacked is illustrated as an example.

The first semiconductor layer 306 is a p-type semiconductor layer and can be formed using an amorphous silicon film containing an impurity element imparting p-type conductivity. The first semiconductor layer 306 is formed by a plasma-enhanced CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a chemical vapor deposition method, a sputtering method, or the like may be used. The first semiconductor layer 306 is preferably formed to have a thickness of 10 nm to 50 nm, inclusive.

The second semiconductor layer 308 is an i-type semiconductor layer (intrinsic semiconductor layer) and is formed using an amorphous silicon film. As for formation of the second semiconductor layer 308, an amorphous silicon film is formed with a plasma-enhanced CVD method using a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 308 may be alternatively formed by an LPCVD method, a chemical vapor deposition method, a sputtering method, or the like. The second semiconductor layer 308 is preferably formed to have a thickness of 200 nm to 1000 nm, inclusive.

The third semiconductor layer 310 is an n-type semiconductor layer and is formed using an amorphous silicon film containing an impurity element imparting an n-type conductivity. The third semiconductor layer 310 is formed by a plasma-enhanced CVD method with the use of a semiconductor source gas containing an impurity element belonging to Group 15 (such as phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In that case, as a method for forming the amorphous silicon film, an LPCVD method, a chemical vapor deposition method, a sputtering method, or the like may be used. The third semiconductor layer 310 is preferably formed to have a thickness of 20 nm to 200 nm, inclusive.

The first semiconductor layer 306, the second semiconductor layer 308, and the third semiconductor layer 310 are not necessarily formed using an amorphous semiconductor, and they may be formed using a polycrystalline semiconductor or a microcrystalline semiconductor (semi-amorphous semiconductor: SAS).

Since the mobility of holes generated by the photoelectric effect is lower than that of electrons, a pin photodiode has better characteristics when a surface on the p-type semiconductor layer side is used as a light-receiving surface. Here, an example where light received by the photodiode 304 from a surface of the substrate 302, over which a pin photodiode is formed, is converted into electric signals will be described. Further, light from the semiconductor layer having a conductivity type opposite to that of the semiconductor layer on the light-receiving surface is ambient light; therefore, the electrode layer is preferably formed using a light-blocking conductive film. Note that a surface on the n-type semiconductor layer side can alternatively be used as the light-receiving surface.

With the use of an insulating material, the insulating layer 316, the protective insulating layer 318, the interlayer insulating layer 320, and the interlayer insulating layer 323 can be formed, depending on the material, with a method such as a sputtering method, an SOG method, spin coating, dip coating, spray coating, or a droplet discharge method (e.g., an ink-jet method, screen printing, or offset printing), or with a tool (equipment) such as a doctor knife, a roll coater, a curtain coater, or a knife coater.

As the insulating layer 316, a single layer or a stacked layer of an oxide insulating layer such as a silicon oxide layer, a silicon oxynitride layer, an aluminum oxide layer, an aluminum oxynitride layer, or the like can be used.

As an inorganic insulating material of the protective insulating layer 318, a single layer or a stacked layer of a nitride insulating layer such as a silicon nitride layer, a silicon nitride oxide layer, an aluminum nitride layer, an aluminum nitride oxide layer, or the like can be used. High-density plasma-enhanced CVD with the use of microwaves (2.45 GHz) is preferably employed since formation of a dense and high-quality insulating layer having high withstand voltage is possible.

For reduction of the surface roughness, an insulating film functioning as a planarization insulating film is preferably used as the interlayer insulating layers 320 and 323. The interlayer insulating layers 320 and 323 can be formed using an organic insulating material having heat resistance such as polyimide, acrylic, benzocyclobutene, polyamide, or epoxy. Other than such organic insulating materials, it is possible to use a single layer or a stacked layer of a low-dielectric constant material (a low-k material), a siloxane-based resin, phosphosilicate glass (PSG), borophosphosilicate glass (BPSG), or the like.

When light incident on the photodiode 304 is detected, information on an object can be read. Note that a light source such as a backlight can be used at the time of reading information on an object.

The transistor an example of which is described in Embodiment 1 or Embodiment 2 can be used as the transistor 300. A transistor including an oxide layer purified by intentionally eliminating an impurity such as hydrogen, moisture, hydroxyl, or hydride (also referred to as a hydrogen compound) from an oxide semiconductor layer, the variation in electrical characteristics of the transistor due to light irradiation is suppressed and the transistor is electrically stable.

Accordingly, characteristics of a semiconductor device are stable even in the case like that of a semiconductor device having an image sensor function, which is used in a place irradiated with light, so that a highly reliable semiconductor device can be provided.

Embodiment 5

A display device disclosed in the present invention can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko pinball machine, and the like. In this embodiment, examples of electronic devices including any of the liquid crystal display devices of the above-described embodiments are described.

Figure 13A:
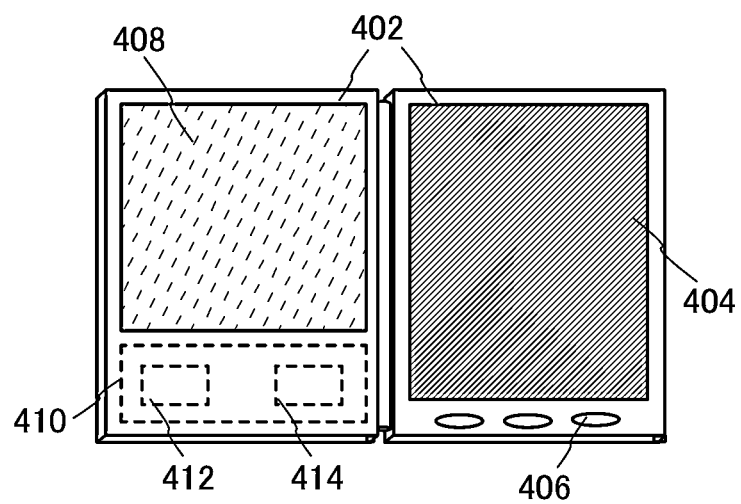
FIGS. 13A and 13B each illustrate an electronic device.

FIG. 13A illustrates an electronic book reader (also referred to as an e-book reader) which can include a housing 402, a display portion 404, operation keys 406, a solar battery 408, and a charge and discharge control circuit 410. The e-book reader illustrated in FIG. 13A can have a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that in FIG. 13A, a structure including a battery 412 and a DCDC converter (hereinafter abbreviated as a converter) 414 is illustrated as an example of the charge and discharge control circuit 410. The semiconductor device described in any of Embodiments 1 to 3 can be applied to the display portion 404, whereby a highly reliable e-book reader can be provided.

When a semi-transmissive liquid crystal display device or a reflective liquid crystal display device is used as the display portion 404, the e-book reader is expected to be used in a relatively bright environment, in which case the structure illustrated in FIG. 13A is preferable because power generation by the solar battery 408 and charge in the battery 412 are effectively performed. The solar battery 408 can be appropriately provided in an unoccupied space (a front surface and a back surface) of the housing 402 and charge in the battery 412 is efficiently performed, which is favorable. Note that when a lithium ion battery is used as the battery 412, there is an advantage of downsizing or the like.

Figure 13B:
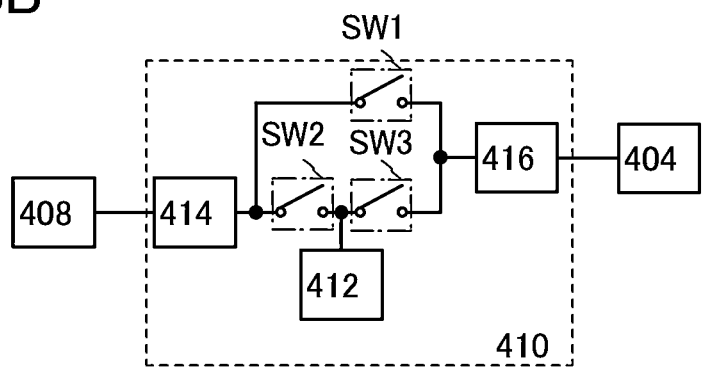

The structure and the operation of the charge and discharge control circuit 410 illustrated in FIG. 13A will be described with reference to a block diagram in FIG. 13B. The solar battery 408, the battery 412, the converter 414, a converter 416, switches SW1 to SW3, and the display portion 404 are illustrated in FIG. 13B, and the battery 412, the converter 414, the converter 416, and the switches SW1 to SW3 correspond to the charge and discharge control circuit 410.

First, an example of operation in the case where power is generated by the solar battery 408 using external light is described. The voltage of electric power generated by the solar battery is raised or lowered by the converter 414 so that the electric power has voltage for charging the battery 412. Then, when the electric power from the solar battery 408 is used for the operation of the display portion 404, the switch SW1 is turned on and the voltage of the electric power is raised or lowered by the converter 416 so as to be voltage needed for the display portion 404. In addition, when display on the display portion 404 is not performed, the switch SW1 is turned off and the switch SW2 is turned on so that charge of the battery 412 may be performed.

Next, operation in the case where power is not generated by the solar battery 408 using external light is described. The voltage of electric power accumulated in the battery 412 is raised or lowered by the converter 416 by turning on the switch SW3. Then, electric power from the battery 412 is used for the operation of the display portion 404.

Note that although the solar battery 408 is described as an example of a means for charge, charge of the battery 412 may be performed with another means. In addition, a combination of the solar battery 408 and another means for charge may be used.

Figure 14A:
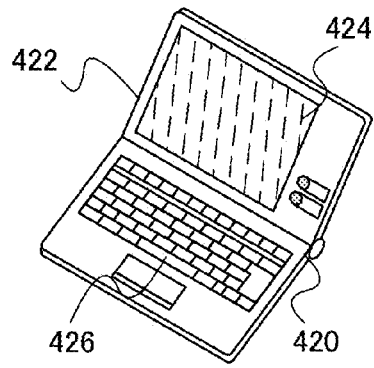
FIGS. 14A to 14F each illustrate an electronic device.

FIG. 14A illustrates a laptop personal computer, which includes a main body 420, a housing 422, a display portion 424, a keyboard 426, and the like. The semiconductor device described in any of Embodiments 1 to 3 is applied to the display portion 424, whereby the highly reliable laptop personal computer can be provided.

Figure 14B:
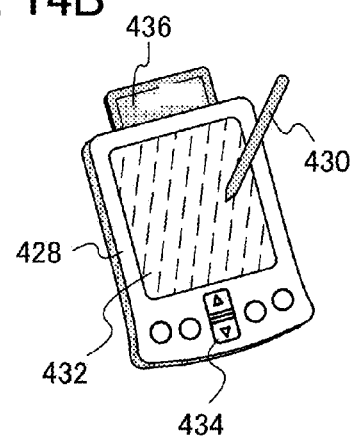

FIG. 14B illustrates a personal digital assistant (PDA), which includes a main body 428 provided with a display portion 432, an external interface 436, operational buttons 434, and the like. In addition, a stylus 430 is included as an accessory for operation. The semiconductor device described in any of Embodiments 1 to 4 is applied to the display portion 432, whereby the highly reliable personal digital assistant (PDA) can be provided.

Figure 14C:
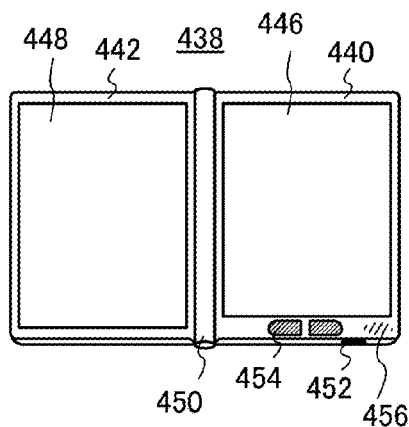

FIG. 14C shows an example of an e-book reader. For example, an e-book reader 438 includes two housings: a housing 440 and a housing 442. The housings 440 and 442 are bound with each other by an axis portion 450, along which the e-book reader can be opened and closed. With such a structure, the e-book reader can operate like a paper book.

A display portion 446 is incorporated in the housing 440, and a display portion 448 is incorporated in the housing 442. The display portion 446 and the display portion 448 may display one image or different images. In the structure where different images are displayed on different display portions, for example, the right display portion (the display portion 446 in FIG. 14C) displays text and the left display portion (the display portion 448 in FIG. 14C) displays images. The semiconductor device described in any of Embodiments 1 to 3 is applied to the display portion 446 and the display portion 448, whereby the highly reliable e-book reader 438 can be provided.

FIG. 14C illustrates an example in which the housing 440 is provided with an operation portion and the like. For example, the housing 440 is provided with a power supply 452, an operation key 454, a speaker 456, and the like. With the operation key 454, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 438 may have a function of an electronic dictionary.

The e-book reader 438 may have a structure capable of wirelessly transmitting and receiving data. Through wireless communication, desired book data or the like can be purchased and downloaded from an e-book server.

Figure 14D:
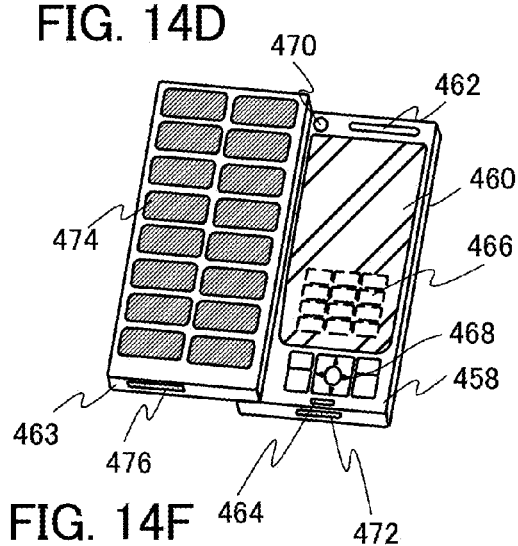

FIG. 14D illustrates a mobile phone, which includes two housings: a housing 463 and a housing 458. The housing 458 is provided with a display panel 460, a speaker 462, a microphone 464, a pointing device 468, a camera lens 470, an external connection terminal 472, and the like. Further, the housing 463 includes a solar battery cell 474 for charging of the personal digital assistant, an external memory slot 476, and the like. Furthermore, an antenna is incorporated in the housing 458. The semiconductor device described in any of Embodiments 1 to 3 is applied to the display panel 460, whereby the highly reliable mobile phone can be provided.

The display panel 460 is provided with a touch panel. A plurality of operation keys 466 which is displayed as images is illustrated by dashed lines in FIG. 14D. Note that the display panel is also mounted with a booster circuit for raising voltage output from the solar battery cell 474 to voltage needed for each circuit.

The display panel 460 changes the orientation of display as appropriate in accordance with the application mode. Further, the camera lens 470 is provided on the same surface as the display panel 460, so that the mobile phone can be used as a video phone. The speaker 462 and the microphone 464 can be used for videophone calls, recording, and playing sound, etc. as well as voice calls. Moreover, the housings 463 and 458 in a state where they are developed as illustrated in FIG. 14D can shift by sliding so that one is lapped over the other; therefore, the size of the mobile phone can be reduced, which makes the mobile phone suitable for being carried.

The external connection terminal 472 can be connected to an AC adapter and various types of cables such as a USB cable, and charging and data communication with a personal computer or the like are possible. Furthermore, a larger amount of data can be stored and moved by inserting a recording medium into the external memory slot 476. Further, in addition to the above-described functions, an infrared communication function, a television reception function, or the like may be provided.

Figure 14E:
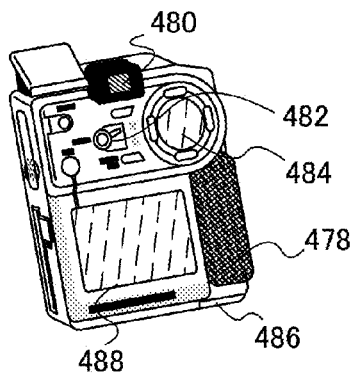

FIG. 14E illustrates a digital video camera, which includes a main body 478, a display portion (A) 488, an eyepiece 480, an operation switch 482, a display portion (B) 484, a battery 486, and the like. The semiconductor device described in any of Embodiments 1 to 3 is applied to the display portion (A) 488 and the display portion (B) 484, whereby the highly reliable digital video camera can be provided.

Figure 14F:
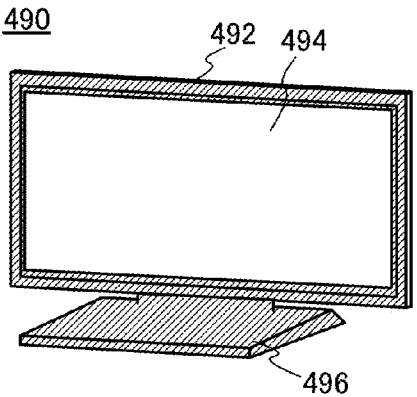

FIG. 14F illustrates an example of a television set. In a television set 490, a display portion 494 is incorporated in a housing 492. The display portion 494 can display images. Further, the housing 492 is supported by a stand 496 here. The semiconductor device described in any of Embodiments 1 to 3 is applied to the display portion 494, whereby the highly reliable television set 490 can be provided.

The television set 490 can be operated with an operation switch of the housing 492 or a separate remote controller. Further, the remote controller may be provided with a display portion for displaying data output from the remote controller.

Note that the television set 490 is provided with a receiver, a modem, and the like. A general television broadcast can be received with the receiver. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

This application is based on Japanese Patent Application serial no. 2010-035469 filed with Japan Patent Office on Feb. 19, 2010, the entire contents of which are hereby incorporated by reference.

EXPLANATION OF REFERENCE

100: transistor, 102: substrate, 104: gate electrode, 106: gate insulating layer, 107: oxide semiconductor film, 108: oxide semiconductor layer, 110: source electrode, 112: drain electrode, 114: insulating layer, 116: protective insulating layer, 200: first substrate, 202: pixel portion, 204: signal line driver circuit, 206: scan line driver circuit, 208: sealant, 210: flexible printed circuit, 211: flexible printed circuit, 212: second substrate, 214: liquid crystal layer, 216: transistor, 218: transistor, 220: liquid crystal element, 222: connection terminal electrode, 224: terminal electrode, 226: anisotropic conductive film, 228: insulating layer, 229: insulating layer, 230: insulating film, 232: first electrode layer, 234: second electrode layer, 236: insulating film, 238: insulating film, 240: spacer, 242: partition, 244: electroluminescent layer, 246: light-emitting element, 248: filler, 250: cavity, 252: spherical particle, 254: filler, 256: black region, 258: white region, 300: transistor, 301: transistor, 302: substrate, 303: gate electrode layer, 304: photodiode, 306: first semiconductor layer, 308: second semiconductor layer, 310: third semiconductor layer, 312: adhesive layer, 314: substrate, 316: insulating layer, 318: protective insulating layer, 320: interlayer insulating layer, 322: electrode layer, 323: interlayer insulating layer, 324: electrode layer, 326: conductive layer, 327: gate signal line, 328: photosensor output signal line, 329: photosensor reference signal line, 402: housing, 404: display portion, 406: operation key, 408: solar battery, 410: charge and discharge control circuit, 412: battery, 414: converter, 416: converter, 420: main body, 422: housing, 424: display portion, 426: keyboard, 428: main body, 430: stylus, 432: display portion, 434: operational button, 436: external interface, 438: e-book reader, 440: housing, 442: housing, 446: display portion, 448: display portion, 450: axis portion, 452: power supply, 454: operation key, 456: speaker, 458: housing, 460: display panel, 462: speaker, 463: housing, 464: microphone, 466: operation key, 468: pointing device, 470: camera lens, 472: external connection terminal, 474: solar battery cell, 476: external memory slot, 478: main body, 480: eyepiece, 482: operation switch, 484: display portion (B), 486: battery, 488: display portion (A), 490: television set, 492: housing, 494: display portion, and 496: stand.

The invention claimed is:
1. A semiconductor device comprising:
a transistor; and
a photodiode over the transistor;
wherein the transistor comprises:
   a gate electrode;
   a gate insulating layer adjacent to the gate electrode;
   an oxide semiconductor layer adjacent to the gate electrode with the gate insulating layer interposed therebetween; and
   a silicon oxide film in contact with the oxide semiconductor layer,
wherein the gate electrode is electrically connected to a first terminal of the photodiode,
wherein the oxide semiconductor layer comprises a channel formation region, wherein an absolute value of an amount of a variation of a threshold voltage of the transistor due to irradiation of light to at least a part of the oxide semiconductor layer at $1\times10^{13}$ photons/cm$^2$·sec is less than or equal to 0.65 V, the light having a wavelength of 350 nm, and wherein a carrier density of the oxide semiconductor layer is lower than $1\times10^{14}$/cm$^3$.

2. The transistor according to claim 1, wherein the absolute value of the amount of the variation of the threshold voltage of the transistor is less than or equal to 0.55 V.

3. A display device comprising the transistor according to claim 1, wherein the transistor is provided in a pixel portion.

4. A semiconductor device comprising:
a transistor; and
a photodiode over the transistor;
wherein the transistor comprises:
a gate electrode;
a gate insulating layer adjacent to the gate electrode;
an oxide semiconductor layer adjacent to the gate electrode with the gate insulating layer interposed therebetween; and
a silicon oxide film in contact with the oxide semiconductor layer,
wherein the gate electrode is electrically connected to a first terminal of the photodiode,
wherein the oxide semiconductor layer comprises a channel formation region,
wherein an absolute value of an amount of a variation of a threshold voltage of the transistor due to irradiation of light to at least a part of the oxide semiconductor layer at an intensity of 10 μW/cm$^2$ for 90 seconds is less than or equal to 0.65 V, the light having a wavelength of 350 nm, and
wherein a carrier density of the oxide semiconductor layer is lower than $1\times10^{14}$/cm$^3$.

5. The transistor according to claim 4, wherein the absolute value of the amount of the variation of the threshold voltage of the transistor is less than or equal to 0.55 V.

6. A display device comprising the transistor according to claim 4, wherein the transistor is provided in a pixel portion.

7. A semiconductor device comprising:
a transistor; and
a photodiode over the transistor;
wherein the transistor comprises:
a gate electrode;
a gate insulating layer adjacent to the gate electrode;
an oxide semiconductor layer adjacent to the gate electrode with the gate insulating layer interposed therebetween; and
a silicon oxide film in contact with the oxide semiconductor layer,
wherein the gate electrode is electrically connected to a first terminal of the photodiode,
wherein the oxide semiconductor layer comprises a channel formation region,
wherein an absolute value of an amount of a variation of a gate voltage value of the transistor at drain current of $1\times10^{-10}$ A due to irradiation of light to at least a part of the oxide semiconductor layer at $1\times10^{13}$ photons/cm$^2$·sec is less than or equal to 3.0 V, the light having a wavelength greater than or equal to 350 nm, and
wherein a carrier density of the oxide semiconductor layer is lower than $1\times10^{14}$/cm$^3$.

8. The transistor according to claim 7, wherein the absolute value of the amount of the variation of the gate voltage value is less than or equal to 2.5 V.

9. A display device comprising the transistor according to claim 7, wherein the transistor is provided in a pixel portion.

10. A semiconductor device comprising:
a transistor; and
a photodiode over the transistor;
wherein the transistor comprises:
a gate electrode;
a gate insulating layer adjacent to the gate electrode;
an oxide semiconductor layer adjacent to the gate electrode with the gate insulating layer interposed therebetween; and
a silicon oxide film in contact with the oxide semiconductor layer,
wherein the gate electrode is electrically connected to a first terminal of the photodiode,
wherein the oxide semiconductor layer comprises a channel formation region,
wherein an absolute value of an amount of a variation of a gate voltage value of the transistor at drain current of $1\times10^{-10}$ A due to irradiation of light to at least a part of the oxide semiconductor layer at an intensity of 10 μW/cm$^2$ for 90 seconds is less than or equal to 3.0 V, the light having a wavelength greater than or equal to 350 nm, and
wherein a carrier density of the oxide semiconductor layer is lower than $1\times10^{14}$/cm$^3$.

11. The transistor according to claim 10, wherein the absolute value of the amount of the variation of the gate voltage value is less than or equal to 2.5 V.

12. A display device comprising the transistor according to claim 10, wherein the transistor is provided in a pixel portion.

13. A semiconductor device comprising:
a transistor; and
a photodiode over the transistor;
wherein the transistor comprises:
a gate electrode;
a gate insulating layer adjacent to the gate electrode;
an oxide semiconductor layer adjacent to the gate electrode with the gate insulating layer interposed therebetween; and
a silicon oxide film in contact with the oxide semiconductor layer,
wherein the gate electrode is electrically connected to a first terminal of the photodiode,
wherein the oxide semiconductor layer comprises a channel formation region,
wherein an absolute value of an amount of a variation of a threshold voltage of the transistor due to an application of a negative gate bias is smaller than an absolute value of an amount of a variation of a threshold voltage of the transistor due to an application of a positive gate bias,
wherein the application of the positive gate bias and the application of the negative gate bias are preformed at the same electric field strength for the same period, and
wherein a carrier density of the oxide semiconductor layer is lower than $1\times10^{14}$/cm$^3$.

14. The transistor according to claim 13, wherein the absolute value of the amount of the variation of the threshold voltage of the transistor due to the application of the negative gate bias is less than or equal to 2.57 V.

15. A display device comprising the transistor according to claim 13, wherein the transistor is provided in a pixel portion.

* * * * *